(12) United States Patent
Baek et al.

(10) Patent No.: US 12,213,310 B2
(45) Date of Patent: Jan. 28, 2025

(54) SEMICONDUCTOR DEVICES AND DATA STORAGE SYSTEMS INCLUDING THE SAME

(71) Applicant: SAMSUNG ELECTRONICS CO., LTD., Suwon-si (KR)

(72) Inventors: Seokcheon Baek, Hwaseong-si (KR); Seungjun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 588 days.

(21) Appl. No.: 17/514,019

(22) Filed: Oct. 29, 2021

(65) Prior Publication Data

US 2022/0231038 A1    Jul. 21, 2022

(30) Foreign Application Priority Data

Jan. 18, 2021   (KR) ........................ 10-2021-0006784

(51) Int. Cl.
*H10B 41/27* (2023.01)
*H01L 25/10* (2006.01)
(Continued)

(52) U.S. Cl.
CPC ............. *H10B 41/27* (2023.02); *H01L 25/18* (2013.01); *H10B 43/27* (2023.02); *H01L 25/0657* (2013.01); *H01L 25/105* (2013.01)

(58) Field of Classification Search
CPC ........ H10B 41/27; H10B 41/30; H10B 41/50; H10B 43/27; H10B 43/10; H10B 43/40;
(Continued)

(56) References Cited

U.S. PATENT DOCUMENTS

2017/0117222 A1    4/2017  Kim et al.
2018/0166454 A1    6/2018  Pyon et al.
(Continued)

FOREIGN PATENT DOCUMENTS

KR    10-2017-0046892 A    5/2017
KR    10-2018-0066383 A    6/2018
(Continued)

*Primary Examiner* — Mohammad A Rahman
*Assistant Examiner* — Sandra Milena Rodriguez Villan
(74) *Attorney, Agent, or Firm* — Muir Patent Law, PLLC

(57) ABSTRACT

A semiconductor device includes a substrate having a first region and a second region, gate electrodes stacked in a first direction on the first region and each including a pad region having an upper surface exposed upwardly in the second region, channel structures penetrating the gate electrodes and extending in the first direction, separation regions penetrating the gate electrodes and extending in the second direction, contact plugs each penetrating the pad region of each of the gate electrodes and extending in the first direction, a nitride layer disposed in an external side of a lowermost first gate electrode among the gate electrodes, spaced apart from the lowermost first gate electrode, and extending horizontally, and a dummy gate electrode disposed between the lowermost first gate electrode and the nitride layer in the second direction and having a first end spaced apart from the lowermost first gate electrode.

18 Claims, 29 Drawing Sheets

(51) Int. Cl.
  *H01L 25/18*  (2023.01)
  *H10B 43/27*  (2023.01)
  *H01L 25/065*  (2023.01)

(58) Field of Classification Search
  CPC ........ H10B 43/50; H10B 43/30; H10B 80/00; H01L 25/18; H01L 25/105; H01L 27/0688; H01L 2225/06541; H01L 2225/06562; H01L 21/76898
  See application file for complete search history.

(56) References Cited

U.S. PATENT DOCUMENTS

| | | | |
|---|---|---|---|
| 2018/0166462 | A1 | 6/2018 | Kim et al. |
| 2018/0308559 | A1 | 10/2018 | Kim et al. |
| 2019/0013237 | A1 | 1/2019 | Nam et al. |
| 2019/0326316 | A1* | 10/2019 | Son ..................... H10B 43/50 |
| 2019/0363006 | A1 | 11/2019 | Min |
| 2020/0027896 | A1 | 1/2020 | Eom |
| 2020/0091071 | A1 | 3/2020 | Lee et al. |
| 2020/0176464 | A1 | 6/2020 | Jang et al. |

FOREIGN PATENT DOCUMENTS

| | | |
|---|---|---|
| KR | 10-2018-0066745 A | 6/2018 |
| KR | 10-2018-0119738 A | 11/2018 |
| KR | 10-2019-0006142 A | 1/2019 |
| KR | 10-2019-0135336 A | 12/2019 |
| KR | 10-2020-0010954 A | 1/2020 |
| KR | 10-2020-0031205 A | 3/2020 |
| KR | 10-2020-0067424 A | 6/2020 |

* cited by examiner

A

B

D

SEMICONDUCTOR DEVICES AND DATA STORAGE SYSTEMS INCLUDING THE SAME

CROSS TO REFERENCE TO RELATED APPLICATION

Korean Patent Application No. 10-2021-0006784, filed on Jan. 18, 2021, in the Korean Intellectual Property Office, and entitled: "Semiconductor Devices and Data Storage Systems Including the Same," is incorporated by reference herein in its entirety.

BACKGROUND

1. Field

Example embodiments relate to a semiconductor device and a data storage system including the same.

2. Description of the Related Art

There has been demand for a semiconductor device which may store high-capacity data in a data storage system using data storage. Accordingly, a measure for increasing data storage capacity of a semiconductor device has been studied. For example, as one method of increasing data storage capacity of a semiconductor device, a semiconductor device including memory cells arranged three-dimensionally, instead of memory cells arranged two-dimensionally, has been suggested.

SUMMARY

Embodiments are directed to a semiconductor device, including a first semiconductor structure including a first substrate and circuit devices on the first substrate, and a second semiconductor structure disposed on the first semiconductor structure, wherein the second semiconductor structure includes a second substrate having a first region and a second region, gate electrodes stacked and spaced apart from each other in a first direction on the first region, extending in a second direction by different lengths on the second region, and each including a pad region having an upper surface exposed upwardly in the second region, interlayer insulating layers alternately stacked with the gate electrodes, channel structures penetrating the gate electrodes, extending in the first direction, and each including a channel layer, separation regions penetrating the gate electrodes and extending in the second direction in the first region and the second region, contact plugs each penetrating the pad region of each of the gate electrodes and extending into the first semiconductor structure in the first direction, first contact plug insulating layers alternately disposed with the interlayer insulating layers below the pad region and surrounding each of the contact plugs, through plugs extending in the first direction to electrically connect the first semiconductor structure to the second semiconductor structure in a third region on an external side of the second substrate, first through plug insulating layers surrounding the through plugs on a level lower than a level of an upper surface of a lowermost first gate electrode among the gate electrodes, and a first nitride layer in contact with external side surfaces of the first through plug insulating layers and extending horizontally in the third region.

Embodiments are directed to a semiconductor device, including a substrate having a first region and a second region, gate electrodes stacked and spaced apart from each other in a first direction on the first region, extending in a second direction by different lengths on the second region, and each including a pad region having an upper surface exposed upwardly in the second region, channel structures penetrating the gate electrodes, extending in the first direction, and each including a channel layer, separation regions penetrating the gate electrodes and extending in the second direction in the first region and the second region, contact plugs each penetrating the pad region of each of the gate electrodes and extending in the first direction, a nitride layer disposed in an external side of a lowermost first gate electrode among the gate electrodes, spaced apart from the lowermost first gate electrode, and extending horizontally, and a dummy gate electrode disposed between the lowermost first gate electrode and the nitride layer in the second direction and having a first end spaced apart from the lowermost first gate electrode.

Embodiments are directed to a data storage system, including a semiconductor storage device including a first substrate, circuit devices on the first substrate, a second substrate having a first region and a second region, gate electrodes stacked and spaced apart from each other in a first direction on the first region, extending in a second direction by different lengths on the second region, and each including a pad region having an upper surface exposed upwardly in the second region, channel structures penetrating the gate electrodes, extending in the first direction, and each including a channel layer, separation regions penetrating the gate electrodes and extending in the second direction in the first region and the second region, contact plugs each penetrating the pad region of each of the gate electrodes and extending in the first direction, a nitride layer disposed in an external side of a lowermost first gate electrode among the gate electrodes, spaced apart from the lowermost first gate electrode, and extending horizontally, a dummy gate electrode disposed between the lowermost first gate electrode and the nitride layer in the second direction and having a first end spaced apart from the lowermost first gate electrode, and an input/output pad electrically connected to the circuit devices, and a controller electrically connected to the semiconductor storage device through the input/output pad and configured to control the semiconductor storage device.

BRIEF DESCRIPTION OF DRAWINGS

Features will become apparent to those of skill in the art by describing in detail example embodiments with reference to the attached drawings in which.

DETAILED DESCRIPTION

Figure 1:
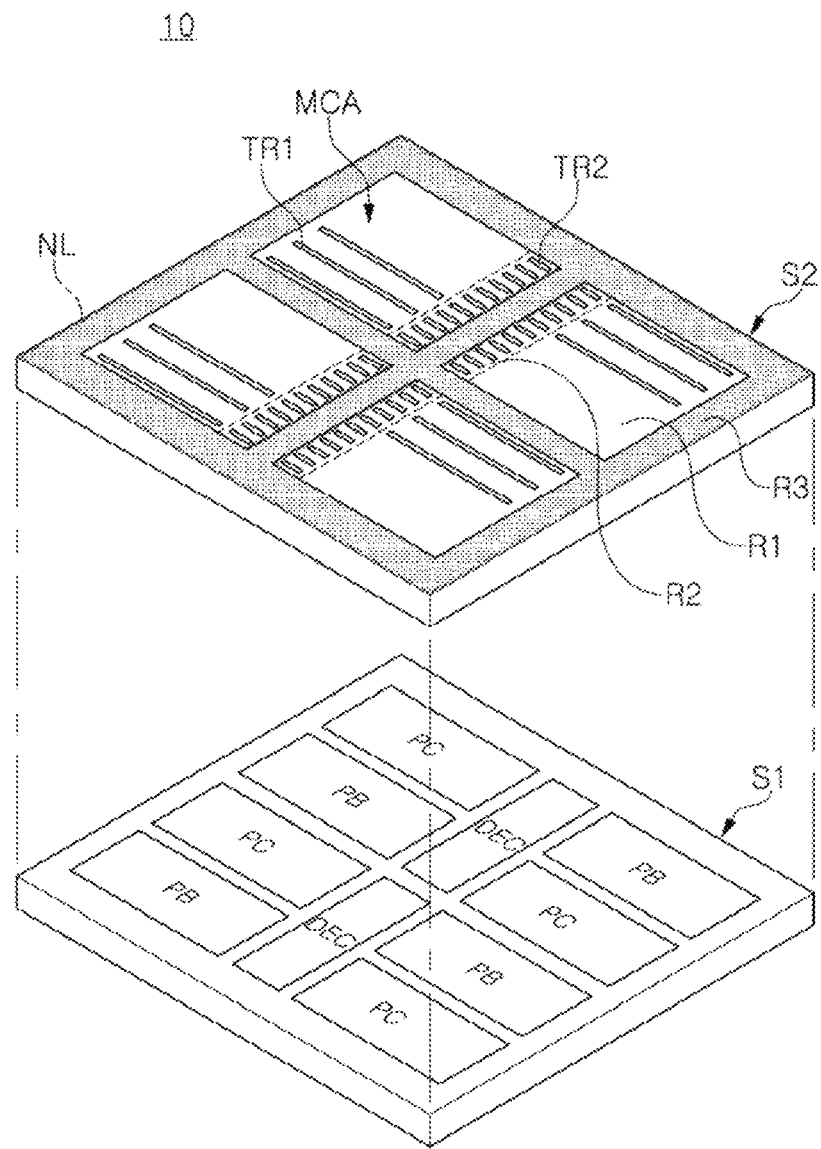
FIG. 1 is a layout view illustrating a semiconductor device according to an example embodiment.

FIG. 1 is a layout view illustrating a semiconductor device according to an example embodiment.

Referring to FIG. 1, a semiconductor device 10 may include first and second semiconductor structures S1 and S2 stacked in a vertical direction. The first semiconductor structure S1 may be configured as a peripheral circuit structure and may include a row decoder DEC, a page buffer PB, and other peripheral circuits PC. The second semiconductor structure S2 may be configured as a memory cell structure and may include memory cell arrays MCA and first and second through interconnection regions TR1 and TR2.

In the first semiconductor structure S1, the row decoder DEC may generate and transmit driving signals of a word line by decoding an input address. The page buffer PB may be connected to the memory cell arrays MCA through bit lines and may read data stored in the memory cells. The other peripheral circuit PC may be configured as a region including a control logic and a voltage generator, and may include, e.g., a latch circuit, a cache circuit, and/or a sense amplifier. The first region R1 may further include a pad region. In this case, the pad region may include an electrostatic discharge (ESD) device or a data input/output circuit.

At least a portion of the various circuit regions DEC, PB, and PC in the first semiconductor structure S1 may be disposed below the memory cell arrays MCA of the second semiconductor structure S2. For example, the page buffer PB and/or other peripheral circuits PC may be disposed below the memory cell arrays MCA to overlap the memory cell arrays MCA. However, circuits included in the first semiconductor structure S1 and the arrangement form thereof may be varied, and accordingly, circuits overlapping the memory cell arrays MCA may also be varied.

The second semiconductor structure S2 may have first to third regions R1, R2, and R3. The first and second regions R1 and R2 may be configured as a region in which a substrate may be disposed such that the memory cell arrays MCA may be disposed. The third region R3 may be configured as a region on an external side of the substrate. The first region R1 may be configured as a region in which the memory cells are disposed. The second region R2 may be configured to electrically connect word lines to the circuit regions DEC, PB, and PC of the first semiconductor structure S1.

In the second semiconductor structure S2, the memory cell arrays MCA may be disposed to be spaced apart from each other. The four memory cell arrays MCA are disposed in FIG. 1, but in example embodiments, the number and the arrangement form of the memory cell arrays MCA disposed on the second semiconductor structure S2 may be varied.

The first and second through interconnection regions TR1 and TR2 may include an interconnection structure penetrating the second semiconductor structure S2 and connected to the first semiconductor structure S1. The first through interconnection regions TR1 may be disposed in the memory cell arrays MCA in the first region R1 by predetermined intervals. For example, an interconnection structure electrically connected to the page buffer PB of the first semiconductor structure S1 may be included. The second through interconnection regions TR2 may be disposed in at least one edge region of the memory cell arrays MCA in the second region R2, and may include an interconnection structure such as a contact plug electrically connected to the row decoder DEC of the first semiconductor structure S1. The number of the second through interconnection regions TR2 may be larger than the number of the first through interconnection regions TR1, but the shape, the number, and the position of the first and second through interconnection regions TR1 and TR2 may be varied in example embodiments.

In the second semiconductor structure S2, the nitride layer NL may remain in a cell region insulating layer 190 (see FIG. 3A) and/or below the cell region insulating layer 190 in the third region R3. The nitride layer NL may remain in an external side edge region of the second region R2 in contact with the third region R3. This configuration will be described in greater detail below with reference to FIGS. 2 to 3B.

Figure 2:
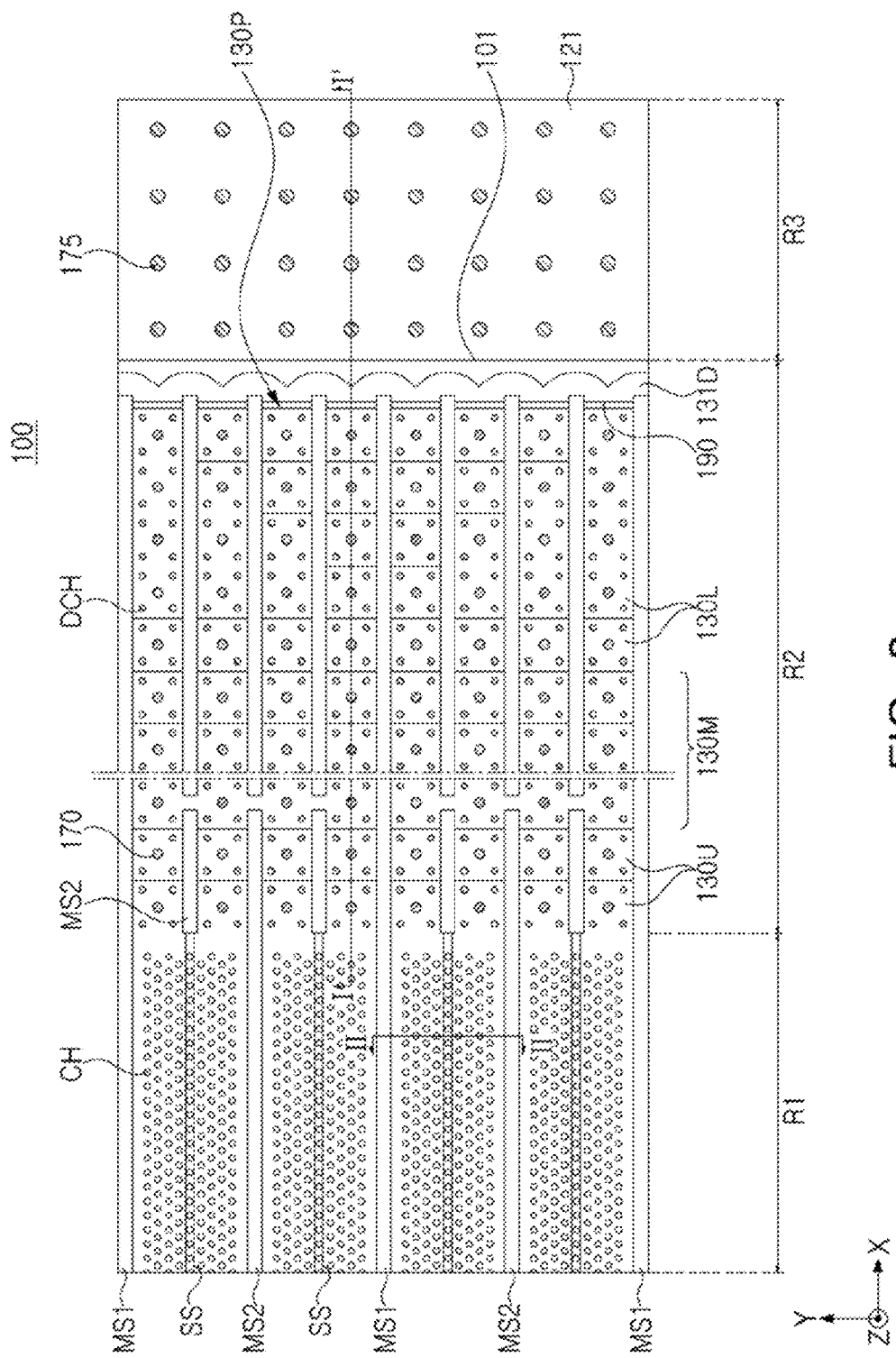
FIG. 2 is a plan view illustrating a semiconductor device according to an example embodiment.
Figure 3A:
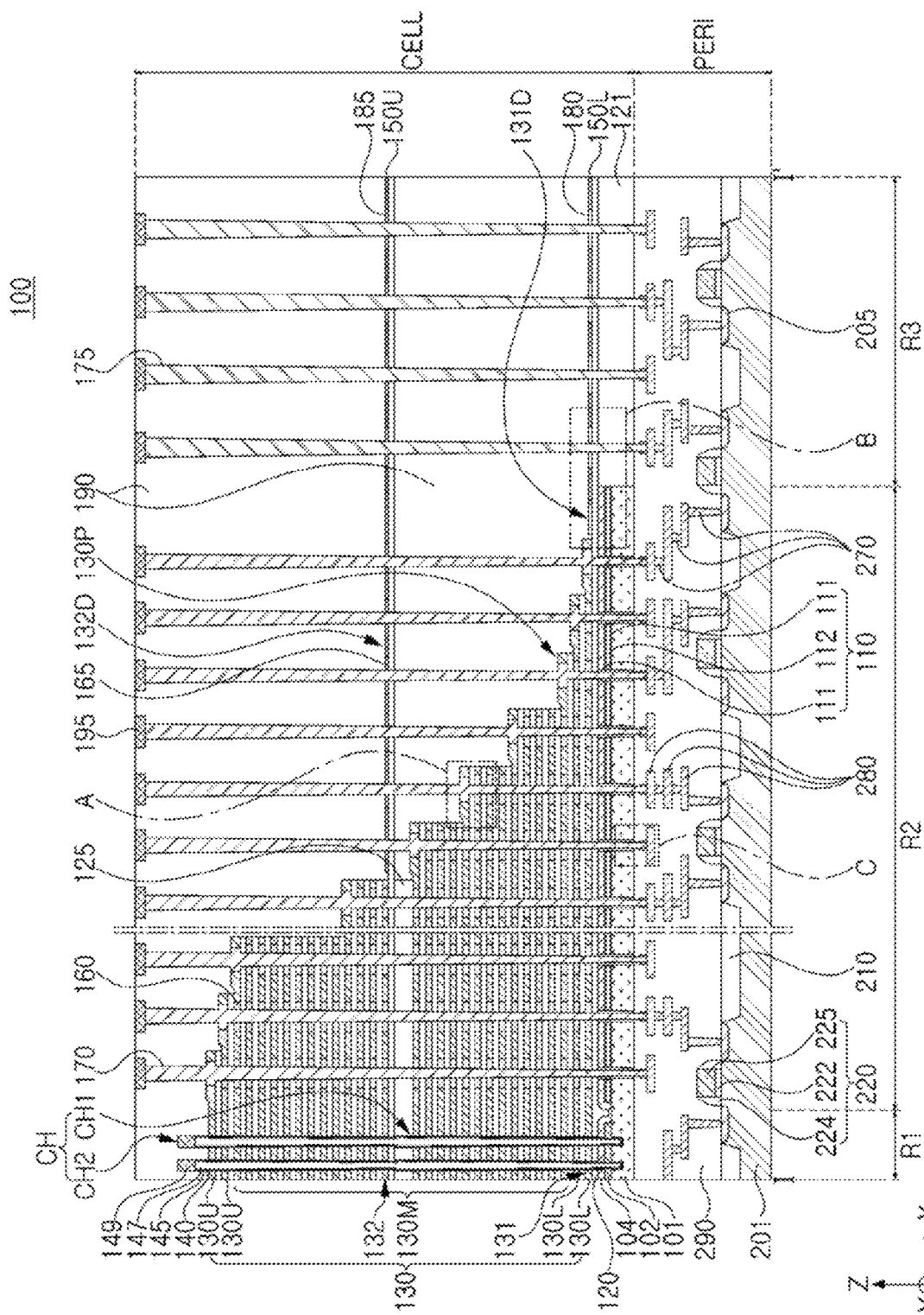
FIGS. 3A and 3B are cross-sectional views illustrating a semiconductor device according to an example embodiment.
Figure 3B:
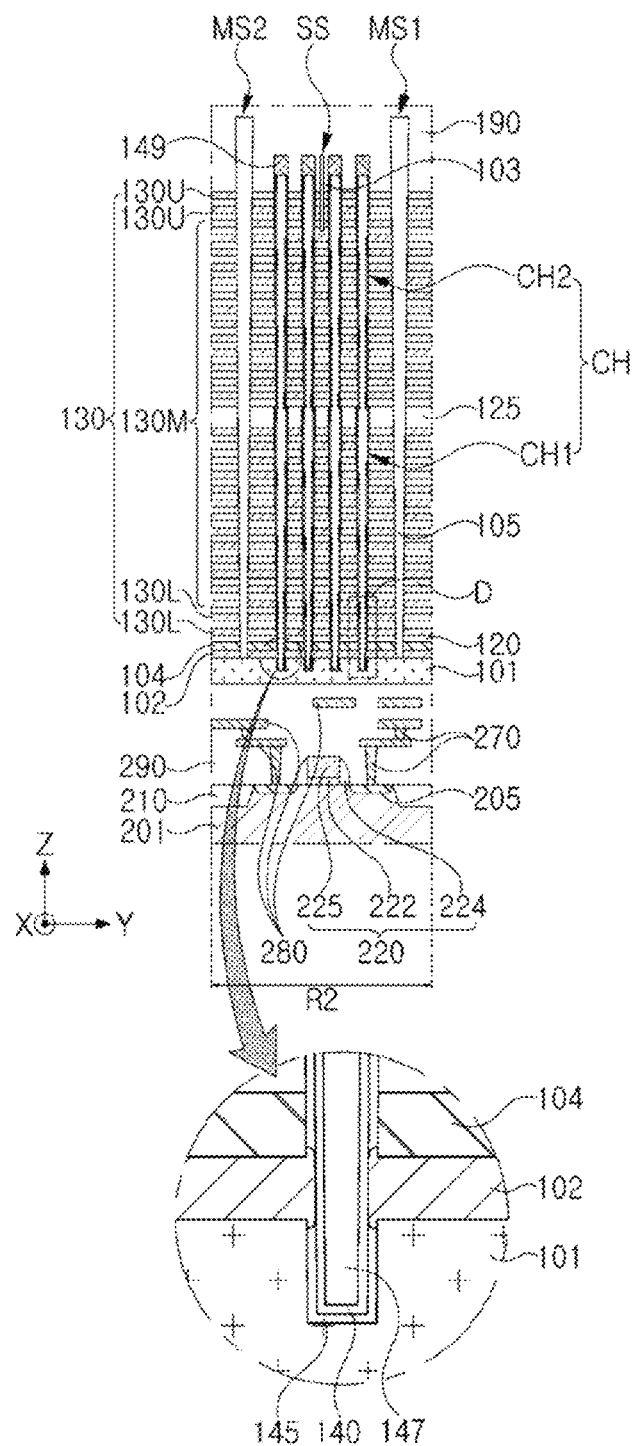
Figure 4A:
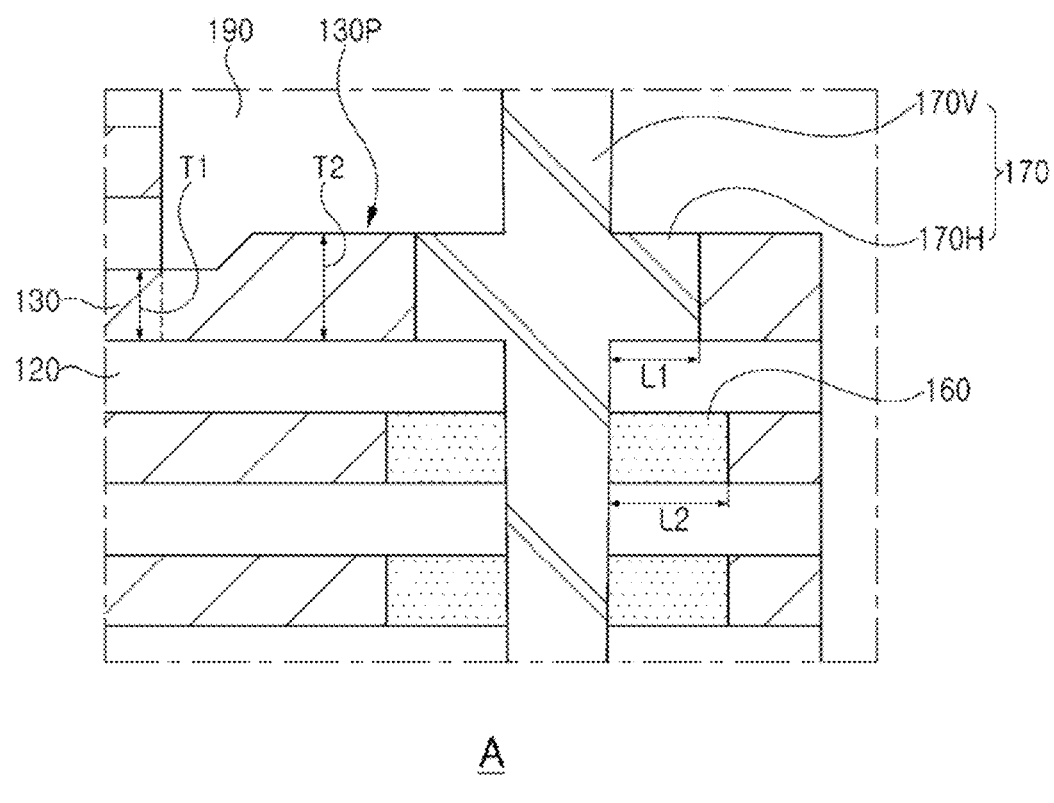
FIGS. 4A to 4C are enlarged views illustrating a partial region of a semiconductor device according to an example embodiment.
Figure 4B:
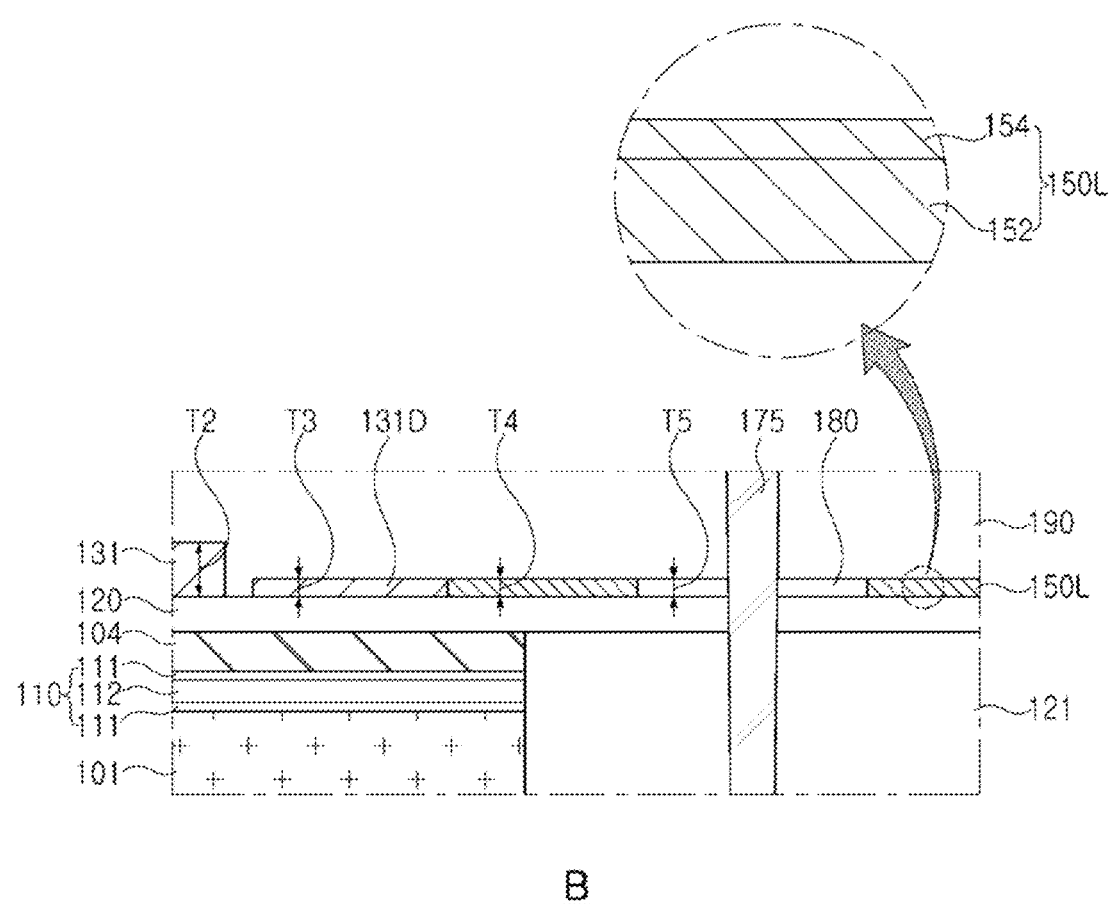
Figure 4C:
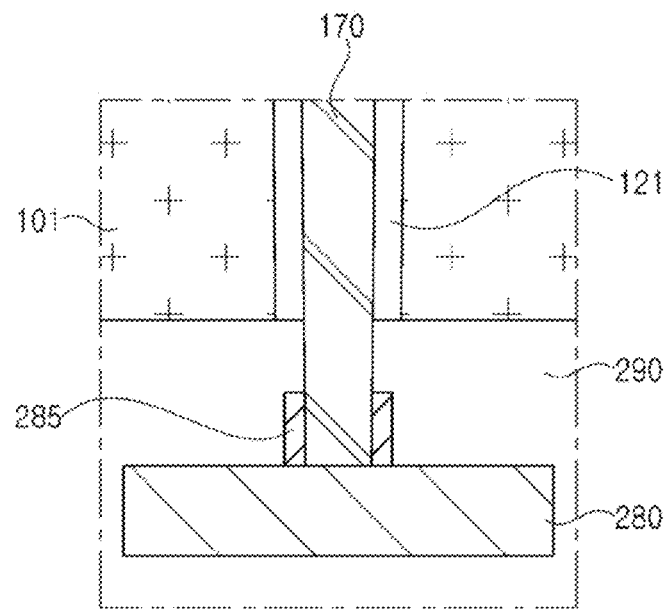

FIG. 2 is a plan view illustrating a semiconductor device according to an example embodiment. FIGS. 3A and 3B are cross-sectional views illustrating a semiconductor device according to an example embodiment. FIG. 3A is a cross-sectional view taken along line I-I' in FIG. 2, and FIG. 3B is a cross-sectional view taken along line II-IF in FIG. 2. FIGS. 4A to 4C are enlarged views illustrating a partial region of a semiconductor device according to an example embodiment. FIG. 4A is an enlarged view illustrating region "A" in FIG. 3A, FIG. 4B is an enlarged view illustrating region "B" in FIG. 3A, and FIG. 4C is an enlarged view illustrating region "C" in FIG. 3A.

Referring to FIGS. 2 to 3B, the semiconductor device 100 may include a peripheral circuit region PERI, which may be a first semiconductor structure including a first substrate 201, and a memory cell region CELL, which may be a second semiconductor structure including a second substrate 101. The memory cell region CELL may be disposed above the peripheral circuit region PERI. In another implementation, in example embodiments, the memory cell region CELL may be disposed below the peripheral circuit region PERI.

The peripheral circuit region PERI may include the first substrate 201, source/drain regions 205 and device separation layers 210 in the first substrate 201, circuit devices 220 disposed on the first substrate 201, circuit contact plugs 270, circuit interconnection lines 280, and a peripheral region insulating layer 290.

The first substrate 201 may have an upper surface extending in the x direction and the y direction. An active region may be defined by the device separation layers 210 on the first substrate 201. The source/drain regions 205 including impurities may be disposed in a portion of the active region. The first substrate 201 may include a semiconductor material, such as a group IV semiconductor, a group III-V compound semiconductor, or a group II-VI compound semiconductor. The first substrate 201 may be provided as a bulk wafer or an epitaxial layer.

The circuit devices 220 may include a planar transistor. Each of the circuit devices 220 may include a circuit gate dielectric layer 222, a spacer layer 224, and a circuit gate electrode 225. The source/drain regions 205 may be disposed in the first substrate 201 on both sides of the circuit gate electrode 225.

The peripheral region insulating layer 290 may be disposed on the circuit device 220 on the first substrate 201. The circuit contact plugs 270 may penetrate the peripheral region insulating layer 290 and may be connected to the source/drain regions 205. An electrical signal may be applied to the circuit device 220 by the circuit contact plugs 270. In a region not illustrated, the circuit contact plugs 270 may also be connected to the circuit gate electrode 225. The circuit interconnection lines 280 may be connected to the circuit contact plugs 270 and may be disposed in a plurality of layers.

The memory cell region CELL may include a second substrate 101 having a first region R1 and a second region R2, gate electrodes 130 stacked on the second substrate 101, interlayer insulating layers 120 alternately stacked with the gate electrodes 130, channel structures CH disposed to penetrate the stack structure of the gate electrodes 130, first and second separation regions MS1 and MS2 extending by penetrating the stack structure of the gate electrodes 130, contact plugs 170 extending by penetrating the gate electrodes 130 in the second region R2, and through plugs 175 disposed in a third region R3 disposed on an external side of the second substrate 101.

The memory cell region CELL may further include first and second contact plug insulating layers 160 and 165 surrounding the contact plugs 170, first and second through plug insulating layers 180 and 185 surrounding the through plugs 175, first and second nitride layers 150L and 150U in contact with the first and second through plug insulating layers 180 and 185, respectively, and first and second dummy gate electrodes 131D and 132D.

The memory cell region CELL may include a first horizontal conductive layer 102 on the first region R1, a horizontal insulating layer 110 disposed in parallel to the first horizontal conductive layer 102 on the second region R2, a second horizontal conductive layer 104 on the first horizontal conductive layer 102 and the horizontal insulating layer 110, a substrate insulating layer 121 penetrating the second substrate 101, upper separation regions SS penetrating a portion of the stack structure of the gate electrodes 130, dummy channel structures DCH disposed to penetrate the stack structure of the gate electrodes 130 in the second region R2, a cell region insulating layer 190, and cell interconnection lines 195.

The first region R1 of the second substrate 101 may be configured as a region in which the gate electrodes 130 may be vertically stacked and the channel structures CH may be disposed, and memory cells may be disposed in the first region R1. The second region R2 may be configured as a region in which the gate electrodes 130 may extend by different lengths, and may be configured to electrically connect the memory cells to the peripheral circuit region PERI. The second region R2 may be disposed on at least one end of the first region R1 in at least one direction, in the x direction, for example.

The second substrate 101 may have an upper surface extending in the x direction and the y direction. The second substrate 101 may include a semiconductor material, such as a group IV semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as a polycrystalline semiconductor layer or an epitaxial layer such as a polycrystalline silicon layer.

The first and second horizontal conductive layers 102 and 104 may be stacked in order on an upper surface of the first region R1 of the second substrate 101. The first horizontal conductive layer 102 may not extend to the second region R2 of the second substrate 101. The second horizontal conductive layer 104 may extend to the second region R2.

The first horizontal conductive layer 102 may function as a portion of a common source line of the semiconductor device 100, and may function as a common source line together with the second substrate 101, for example. Referring to the enlarged view in FIG. 3B, the first horizontal conductive layer 102 may be directly connected to the channel layer 140 around the channel layer 140.

The second horizontal conductive layer 104 may be in contact with the second substrate 101 in regions in which the first horizontal conductive layer 102 and the horizontal insulating layer 110 are not disposed. The second horizontal conductive layer 104 may be bent to cover ends of the first horizontal conductive layer 102 or the horizontal insulating layer 110 in the regions and may extend onto the second substrate 101.

The first and second horizontal conductive layers 102 and 104 may include a semiconductor material. For example, both the first and second horizontal conductive layers 102 and 104 may include polycrystalline silicon. In this case, at least the first horizontal conductive layer 102 may be a doped layer, and the second horizontal conductive layer 104 may be a doped layer or a layer including impurities diffused from the first horizontal conductive layer 102. However, the second horizontal conductive layer 104 may be replaced with an insulating layer.

The horizontal insulating layer 110 may be disposed on the second substrate 101 side by side with the first horizontal conductive layer 102 in at least a portion of the second region R2. The horizontal insulating layer 110 may include first and second horizontal insulating layers 111 and 112 alternately stacked on the second region R2 of the second substrate 101. The horizontal insulating layer 110 may be a layer remaining after a portion thereof are replaced with the first horizontal conductive layer 102 in a process of manufacturing the semiconductor device 100.

The horizontal insulating layer 110 may include silicon oxide, silicon nitride, silicon carbide, or silicon oxynitride. The first horizontal insulating layers 111 and the second horizontal insulating layers 112 may include different insulating materials. For example, the first horizontal insulating layers 111 may be formed of the same material as a material of the interlayer insulating layers 120, and the second horizontal insulating layer 112 may be formed of a material different from a material of the interlayer insulating layers 120.

The substrate insulating layer 121 may extend in the z direction and may penetrate the second substrate 101, the horizontal insulating layer 110, and the second horizontal conductive layer 104 in the second region R2. The substrate insulating layer 121 may be disposed to surround each of the contact plugs 170. Accordingly, the contact plugs 170 connected to the different gate electrodes 130 may be electrically separated from each other. The substrate insulating layer 121 may also be disposed on the third region R3, an external side of the second substrate 101. The substrate insulating layer 121 may include, e.g., silicon oxide, silicon nitride, silicon carbide, or silicon oxynitride.

The gate electrodes 130 may be vertically stacked and spaced apart from each other on the second substrate 101 and may form a stack structure. The gate electrodes 130 may include lower gate electrodes 130L forming a gate of a ground select transistor, memory gate electrodes 130M forming a plurality of memory cells, and upper gate electrodes 130U forming gates of string select transistors. The number of the memory gate electrodes 130M forming the memory cells may be determined according to capacity of the semiconductor device 100. In some example embodiments, each number of the upper and lower gate electrodes 130U and 130L may be 1 to 4 or more, and may have the same structure as or a different structure from that of the memory gate electrodes 130M. In some example embodiments, the gate electrodes 130 may further include a gate electrode 130 disposed above the upper gate electrodes 130U and/or below the lower gate electrodes 130L and forming an erase transistor used in an erase operation using a gate induced drain leakage (GIDL) phenomenon. Also, a portion of the gate electrodes 130, the memory gate electrodes 130M adjacent to the upper or lower gate electrodes 130U and 130L, e.g., may be dummy gate electrodes.

The gate electrodes 130 may be vertically stacked and spaced apart from each other on the first region R1 and may extend from the first region R1 to the second region R2 by different lengths and may form a stepped structure in a staircase shape. Referring to FIG. 3A, the gate electrodes 130 may form a stepped structure between the gate electrodes 130 in the x direction, and may also have a stepped structure in the y direction.

Due to the stepped structure, the lower gate electrode 130L may extend longer than the upper gate electrode 130U such that the gate electrodes 130 may have regions exposed upwardly from the interlayer insulating layers 120, and the regions may be referred to as pad regions 130P. In each of the gate electrodes 130, the pad region 130P may include an end in the x direction. The pad region 130P may correspond to a portion of an uppermost gate electrode 130 among the gate electrodes 130 forming the stack structure in the second region R2 of the second substrate 101. The gate electrodes 130 may be connected to the contact plugs 170 in the pad regions 130P.

The gate electrodes 130 may have an increased thickness in the pad regions 130P. The thickness of each of the gate electrodes 130 may increase in such a manner that a level of the lower surface thereof may be constant and a level of an upper surface thereof may be increased. Referring to FIG. 4A, the gate electrodes 130 may extend from the first region R1 toward the second region R2 by a first thickness T1, and may have a second thickness T2 greater than the first thickness T1 in the pad regions 130P marked by a dotted line in FIG. 4A. The second thickness T2 may range from about 150% to about 210% of the first thickness T1.

The gate electrodes 130 may be separated from each other in the y direction by a first separation region MS1 extending in the x direction. The gate electrodes 130 between a pair of first separation regions MS1 may form one memory block, but the range of the memory block is not limited thereto. The gate electrodes 130 may include a metal material, such as tungsten (W), for example. In some example embodiments, the gate electrodes 130 may include polycrystalline silicon or a metal silicide material.

The interlayer insulating layers 120 may be disposed between the gate electrodes 130. Similarly to the gate electrodes 130, the interlayer insulating layers 120 may be spaced apart from each other in a direction perpendicular to the upper surface of the second substrate 101 and may extend in the x direction. The interlayer insulating layers 120 may include an insulating material such as silicon oxide or silicon nitride.

The first and second separation regions MS1 and MS2 may be disposed to penetrate the gate electrodes 130 and may extend in the x direction. The first and second separation regions MS1 and MS2 may be disposed parallel to each other. The first and second separation regions MS1 and MS2 may penetrate the entire gate electrodes 130 stacked on the second substrate 101 and may be connected to the second substrate 101. The first separation regions MS1 may extend as a single region in the x direction, and the second separation regions MS2 may intermittently extend between a pair of first separation regions MS1 or may be disposed only in a partial region. However, the arrangement order and the number of the first and second separation regions MS1 and MS2 are not limited to the examples illustrated in FIG. 2. Referring to FIG. 3B, a separation insulating layer 105 may be disposed in the first and second separation regions MS1 and MS2. The separation insulating layer 105 may include an insulating material, such as silicon oxide, silicon nitride, or silicon oxynitride, for example.

Referring to FIG. 2, the upper separation regions SS may extend in the x direction between the first separation regions MS1 and the second separation regions MS2 in the first region R1. Referring to FIG. 3B, the upper separation regions SS may separate three gate electrodes 130 including the upper gate electrodes 130U from each other in the y direction. However, the number of gate electrodes 130 separated by the upper separation regions SS may be varied in example embodiments. The upper gate electrodes 130U separated by the upper separation regions SS may form different string select lines. The upper separation insulating layer 103 may be disposed in the upper separation regions SS. The upper separation insulating layer 103 may include an insulating material, such as silicon oxide, silicon nitride, or silicon oxynitride, for example.

Referring to FIG. 2, each of the channel structures CH may form a single memory cell string, and may be spaced apart from each other and may form rows and columns on the first region R1. The channel structures CH may be disposed to form a grid pattern or may be disposed in a zigzag pattern in one direction. The channel structures CH may have a columnar shape, and may have an inclined side surface having a width decreasing towards the second substrate 101 depending on an aspect ratio.

The channel structures CH may include first and second channel structures CH1 and CH2 vertically stacked, as for the example embodiment illustrated in FIG. 3A. In the channel structures CH, first channel structures CH1 penetrating the lower stack structures of the gate electrodes 130 may be connected to second channel structures CH2 penetrating the upper stack structures of the gate electrodes 130, and may have a bent portion due to a difference in width in a connection region. However, the number of channel structures stacked in the z direction may be varied.

Referring to the enlarged view in FIG. 3B, a channel layer 140 may be disposed in the channel structures CH. In the channel structures CH, the channel layer 140 may be formed in an annular shape surrounding a channel filling insulating layer 147 therein. The channel layer 140 may be connected to the first horizontal conductive layer 102 in a lower portion. The channel layer 140 may include a semiconductor material such as polycrystalline silicon or single crystal silicon.

The gate dielectric layer 145 may be disposed between the gate electrodes 130 and the channel layer 140. Although not specifically illustrated, the gate dielectric layer 145 may include a tunneling layer, a charge storage layer, and a blocking layer stacked in order from the channel layer 140. The tunneling layer may tunnel charges to the charge storage layer, and may include, e.g., silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In some example embodiments, at least a portion of the gate dielectric layer 145 may extend in a horizontal direction along the gate electrodes 130. The channel pad 149 may be disposed only on an upper end of the upper second channel structure CH2. The channel pads 149 may include, e.g., doped polycrystalline silicon.

The channel layer 140, the gate dielectric layer 145, and the channel filling insulating layer 147 may be connected to each other between the first channel structure CH1 and the second channel structure CH2. An upper interlayer insulating layer 125 having a relatively great thickness may be disposed between the first channel structure CH1 and the second channel structure CH2, that is, between the lower stack structure and the upper stack structure. However, the shapes of the interlayer insulating layers 120 and the upper interlayer insulating layer 125 may be varied.

The dummy channel structures DCH may be spaced apart from each other and may form rows and columns in the second region R2. The dummy channel structures DCH may have a size larger than that of the channel structures CH on a plan view, but example embodiments are not limited thereto. The dummy channel structures DCH may be further disposed in a portion of the first region R1 adjacent to the second region R2. The dummy channel structures DCH may not be electrically connected to upper interconnection structures, and may not form a memory cell string in the semiconductor device 100, differently from the channel structures CH.

The dummy channel structures DCH may have the same structure as or a different structure from the channel structures CH. When the dummy channel structures DCH are formed together with the channel structures CH, the dummy channel structures DCH may have the same structure as the channel structures CH. When the dummy channel structures DCH are formed using a portion of a process of forming the contact plugs 170, the dummy channel structures DCH may have a structure different from of the channel structures CH. In this case, e.g., the dummy channel structures DCH may have a structure filled with an insulating material such as oxide.

The contact plugs 170 may penetrate the uppermost gate electrodes 130 and the first contact plug insulating layers 160 disposed below the uppermost gate electrodes 130 in the second region R2, and may be connected to the pad regions 130P of the gate electrodes 130. The contact plugs 170 may penetrate at least a portion of the cell region insulating layer 190 and may be connected to each of the pad regions 130P of the gate electrodes 130 exposed upwardly. The contact plugs 170 may penetrate the second substrate 101, the second horizontal conductive layer 104, and the horizontal insulating layer 110 in a lower portion of the gate electrodes 130 and may be connected to the circuit interconnection lines 280 in the peripheral circuit region PERI. The contact plugs 170 may be spaced apart from the second substrate 101, the second horizontal conductive layer 104, and the horizontal insulating layer 110 by the substrate insulating layer 121.

Referring to FIG. 4A, each of the contact plugs 170 may include a vertical extension portion 170V extending in the z direction and a horizontal extension portion 170H extending horizontally from the vertical extension portion 170V and in contact with the pad regions 130P. The vertical extension portion 170V may have a cylindrical shape of which a width may decrease toward the second substrate 101 due to an aspect ratio. The horizontal extension portion 170H may be disposed along a circumference of the vertical extension portion 170V, and may extend from a side surface of the vertical extension portion 170V to the other end by a first length L1. The first length L1 may be shorter than a second length L2 of the lower first contact plug insulating layers 160.

Referring to FIG. 4C, the contact plugs 170 may be surrounded by the substrate insulating layer 121 so as to be electrically separated from the second substrate 101. A region including a lower end of the contact plugs 170 may be surrounded by pad layers 285 on the circuit interconnection lines 280. The pad layers 285 may be configured to protect the circuit interconnection lines 280 during the process of manufacturing the semiconductor device 100, and may include a conductive material, such as polycrystalline silicon, for example.

The contact plugs 170 may include, e.g., at least one of tungsten (W), copper (Cu), aluminum (Al), and an alloy thereof. In some example embodiments, the contact plugs 170 may further include a barrier layer on sidewalls and bottom surfaces of the contact holes in which the contact plugs 170 are disposed. The barrier layer may include, e.g., at least one of titanium (Ti), titanium nitride (TiN), tantalum (Ta), and tantalum nitride (TaN).

The first contact plug insulating layers 160 may be disposed below the pad regions 130P to surround side surfaces of the contact plugs 170. Internal side surfaces of the first contact plug insulating layers 160 may surround the contact plugs 170, and external side surfaces of the first contact plug insulating layers 160 may be surrounded by the gate electrodes 130. Each of the contact plugs 170 may be physically and electrically connected to a single gate electrode 130 by the first contact plug insulating layers 160, and may be electrically separated from the gate electrodes 130 disposed therebelow.

The second contact plug insulating layers 165 may be disposed above the pad regions 130P to surround side surfaces of a portion of the contact plugs 170. For example, the second contact plug insulating layers 165 may be disposed to surround the contact plugs 170 connected to the gate electrodes 130 of the lower stack structure. A gate electrode disposed most adjacent to a lower end of the second channel structures CH2 among the gate electrodes 130 of the upper stack structure may be referred to as a second gate electrode 132. The second contact plug insulating layers 165 may be disposed on a level corresponding to a level of the second gate electrode 132 or a level similar to a level of the second gate electrode 132. In the present example embodiment, "corresponding level" may refer to a level within a range in which a certain component is disposed. Accordingly, the second contact plug insulating layers 165 may be disposed on a level overlapping a level on which the second gate electrode 132 is disposed or on a level similar to a level on which the second gate electrode 132 is disposed. In the present example embodiment, the second contact plug insulating layers 165 may be disposed on a level overlapping a level on which the second gate electrode 132 is disposed, and may be disposed a level lower than a level of the upper surface of the second gate electrode 132.

The first and second contact plug insulating layers 160 and 165 may include an insulating material, and may include, e.g., at least one of silicon oxide, silicon nitride, and silicon oxynitride.

The through plugs 175 may be disposed in the third region R3 of the memory cell region CELL, which may be an external side region of the second substrate 101, and may penetrate the cell region insulating layer 190 and may extend to the peripheral circuit region PERI. The through plugs 175 may be disposed to connect the cell interconnection lines 195 of the memory cell region CELL to the circuit interconnection lines 280 of the peripheral circuit region PERI. The through plugs 175 may include a conductive material, and may include a metal material such as tungsten (W), copper (Cu), and aluminum (Al). The through plugs 175 may be formed in the same process of forming the contact plugs 170, may include the same material, and may have the same internal structure.

The first and second through plug insulating layers 180 and 185 may be disposed to surround side surfaces of the through plugs 175 in lower and upper portions, respectively. The first through plug insulating layers 180 may be disposed in a region corresponding to a lower portion of the gate electrodes 130. For example, the first through plug insulating layers 180 may be disposed on a level corresponding to a level of the lowermost first gate electrode 131 or a level similar to the first gate electrode 131. In the present example embodiment, the first through plug insulating layers 180 may be disposed on a level lower than a level of the upper surface of the first gate electrode 131.

The second through plug insulating layers 185 may be disposed on substantially the same level as a level of the second contact plug insulating layers 165. In the present example embodiment, "substantially the same" refers to an example in which a difference in a range of deviations which may be the same as or occurring in the manufacturing process, and may be interpreted the same even when the expression "substantially" is omitted. For example, the second through plug insulating layers 185 may be disposed on a level corresponding to a level of the second gate electrode 132 or a level similar to a level of the second gate electrode 132.

The first and second through plug insulating layers 180 and 185 may have substantially the same thickness and/or width, but example embodiments are not limited thereto. The second through plug insulating layers 185 may have substantially the same thickness as that of the second contact plug insulating layers 165. The first and second through plug insulating layers 180 and 185 may include an insulating material, and may include, e.g., at least one of silicon oxide, silicon nitride, and silicon oxynitride.

The first and second nitride layers 150L and 150U may correspond to the nitride layer NL described above with reference to FIG. 1. The first and second nitride layers 150L and 150U may extend parallel to the upper surface of the second substrate 101 in a portion of the second region R2 and in the third region R3. The first nitride layer 150L may be in contact with an external side surface of the first through plug insulating layers 180 and may extend horizontally along an x-y plane on a level corresponding to a level of the first gate electrode 131. The second nitride layer 150U may be in contact with external side surfaces of the second through plug insulating layers 185 and may extend horizontally along the x-y plane on a level corresponding to a level of the second gate electrode 132. The first and second nitride layers 150L and 150U may be deposited to thicken the pad regions 130P of the gate electrodes 130 during the manufacturing process and may remain.

Referring to FIG. 4B, the first nitride layer 150L may surround the first through plug insulating layers 180, and may be in contact with the side surface of the first dummy gate electrode 131D on an end adjacent to the second region R2. The first nitride layer 150L may be disposed on a level higher than a level of the upper surface of the second substrate 101. A thickness T4 of the first nitride layer 150L may be substantially the same as a thickness T3 of the first dummy gate electrode 131D and a thickness T5 of the first through plug insulating layers 180. The thickness T4 of the first nitride layer 150L may have a thickness smaller than the increased thickness T2 in the pad region 130P of the first gate electrode 131. For example, the thickness T4 of the first nitride layer 150L may be the same as or similar to a difference between the second thickness T2 and the first thickness T1 described with reference to FIG. 4A.

Similarly, the second nitride layer 150U may also surround the second through plug insulating layers 185 and may be in contact with the second dummy gate electrode 132D on an end adjacent to the second region R2. The second nitride layer 150U may have substantially the same thickness as that of the first nitride layer 150L, and the above description of the thickness T4 of the first nitride layer 150L may be applied thereto.

The first and second nitride layers 150L and 150U may include silicon nitride and may have a composition of $SixN_y$ or $SixN_y$:H. Referring to FIG. 4B, the first and second nitride layers 150L and 150U may include two layers 152 and 154 having different compositions and stacked vertically, but example embodiments are not limited thereto. For example, the lower layer 152 may have a thickness greater than a thickness of the upper layer 154 and may have a high content of hydrogen (H).

The first and second dummy gate electrodes 131D and 132D may be disposed on levels corresponding to levels of the first and second gate electrodes 131 and 132, respectively. The first and second dummy gate electrodes 131D and 132D may be disposed to be spaced apart from ends of the first and second gate electrodes 131 and 132 by a predetermined distance in the x direction, respectively. The distance may be, e.g., about 50 nm or less. Accordingly, the first and second dummy gate electrodes 131D and 132D may be electrically separated from the first and second gate electrodes 131 and 132, respectively.

The first and second dummy gate electrodes 131D and 132D may have first ends spaced apart from the ends of the first and second gate electrodes 131 and 132, respectively, and may have second ends in contact with the first and second nitrides layers 150L and 150U, respectively. In the first and second dummy gate electrodes 131D and 132D, positions of the second ends may be the same or similar in the z direction. The second dummy gate electrode 132D may be in contact with external side surfaces of the second contact plug insulating layers 165 and may surround the second contact plug insulating layers 165.

Referring to FIG. 2, an external side end of the first dummy gate electrode 131D may have a wavy shape along the ends of the first and second separation regions MS1 and MS2 on a plan view, and may surround the ends. The external side end of the second dummy gate electrode 132D may also be disposed above the external side end of the first dummy gate electrode 131D and may have a shape the same as or similar to that of the first dummy gate electrode 131D.

The first and second dummy gate electrodes 131D and 132D may have a region extending outwardly in the x direction, extending farther than the first and second separation regions MS1 and MS2. In the wavy shape, since the first and second dummy gate electrodes 131D and 132D are formed in a region from which a portion of the first and second nitride layers 150L and 150U may be removed, the first and second dummy gate electrodes 131D and 132D may have a shape according to a profile of an etchant injected from the first and second separation regions MS1 and MS2.

As described above with reference to FIG. 4B, the first dummy gate electrode 131D may have substantially the same thickness as that of the first nitride layer 150L and the first through plug insulating layers 180. The second dummy gate electrode 132D may have substantially the same thickness as those of the second contact plug insulating layer 165, the second nitride layer 150U, and the second through plug insulating layers 185. The first and second dummy gate electrodes 131D and 132D may have a thickness smaller than the above-described first thickness T1 and the second thickness T2 of the gate electrodes 130 including the first and second gate electrodes 131 and 132. Also, the first and second dummy gate electrodes 131D and 132D may be formed of the same material as that of the gate electrodes 130.

The cell region insulating layer 190 may be disposed to cover the second substrate 101, the gate electrodes 130 on the second substrate 101, and the peripheral region insulating layer 290. The cell region insulating layer 190 may be formed of an insulating material, or may be formed of a plurality of insulating layers.

The cell interconnection lines 195 may form an upper interconnection structure electrically connected to the memory cells in the memory cell region CELL. The cell interconnection lines 195 may be connected to the contact plugs 170 and the through plugs 175, and may be electrically connected to the gate electrodes 130 and the channel structures CH. In some example embodiments, the number of the contact plugs and the interconnection lines forming the upper interconnection structure may be varied. The cell interconnection lines 195 may include metal, and may include, e.g., tungsten (W), copper (Cu), aluminum (Al), or the like.

Figure 5A:
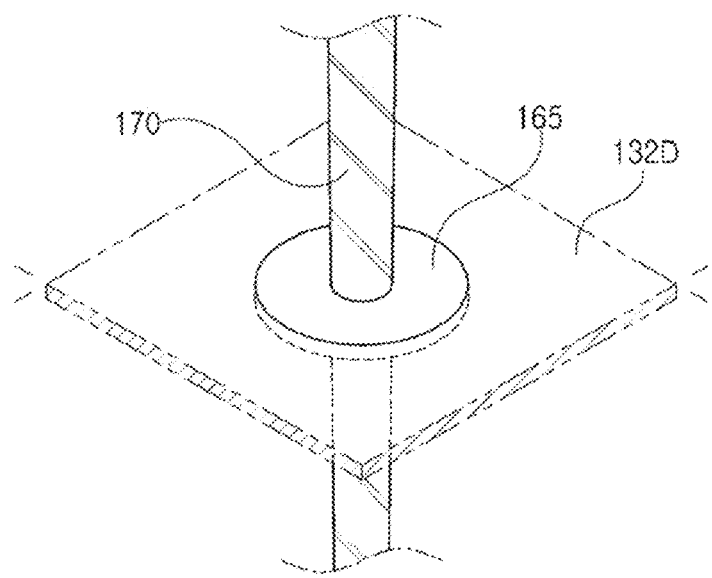
FIGS. 5A and 5B are enlarged perspective views illustrating a partial region of a semiconductor device according to an example embodiment.
Figure 5B:
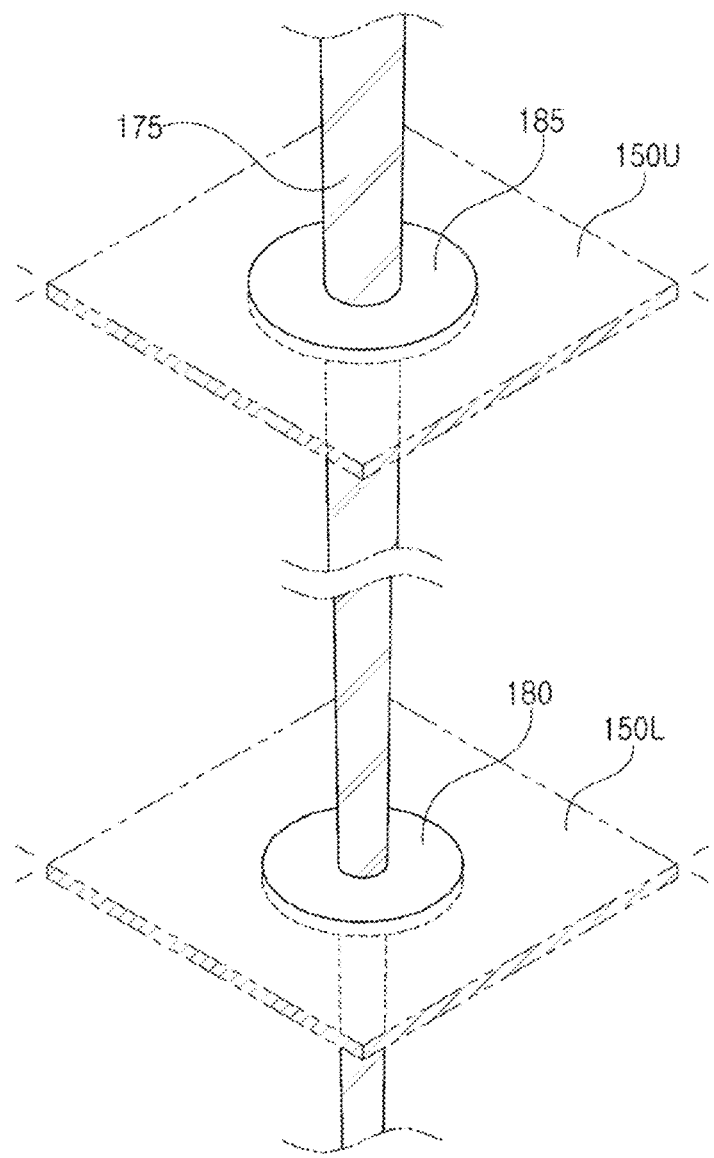

FIGS. 5A and 5B are enlarged perspective views illustrating a partial region of a semiconductor device according to an example embodiment.

FIG. 5A illustrates the arrangement of the contact plug 170 and the second dummy gate electrode 132D. For example, FIG. 5A illustrates the contact plug 170 connected to the gate electrode 130 of the lower stack structure surrounding the lower first channel structures CH1, above the pad region 130P. The contact plug 170 may be surrounded by the second contact plug insulating layer 165, and the second contact plug insulating layer 165 may be surrounded by the second dummy gate electrode 132D.

FIG. 5B illustrates the arrangement of the through plug 175 and the first and second nitride layers 150L and 150U.

The through plug 175 may be surrounded by the first through plug insulating layer 180 in a lower portion, and the first through plug insulating layer 180 may be surrounded by the first nitride layer 150L. The through plug 175 may be surrounded by the second through plug insulating layer 185 in an upper portion, and the second through plug insulating layer 185 may be surrounded by the second nitride layer 150U.

When comparing the contact plug 170 with the through plug 175, both the elements may be surrounded by an insulating layer, but a layer disposed on an external side the insulating layer may be different. For example, in the contact plug 170, the second dummy gate electrode 132D, which may be a conductive material, may be disposed on an external side of the second contact plug insulating layer 165. In the through plug 175, first and second nitride layers 150L and 150U, which may be insulating materials, may be disposed on an external side of the first and second through plug insulating layers 180 and 185.

Figure 6:
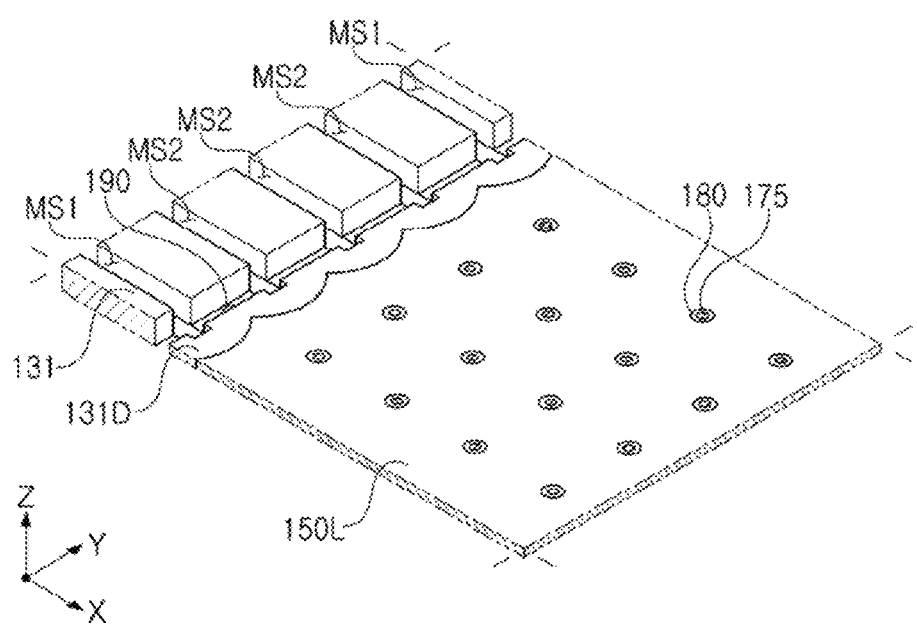
FIG. 6 is an enlarged perspective view illustrating a partial region of a semiconductor device according to an example embodiment.

FIG. 6 is an enlarged perspective view illustrating a partial region of a semiconductor device according to an example embodiment.

FIG. 6 illustrates partial components disposed on a level corresponding to a level of the first gate electrode 131 in FIG. 3A. The first gate electrodes 131 may be separated from each other in they direction by the first and second separation regions MS1 and MS2 in a region including an end portion. The first dummy gate electrode 131D may be spaced apart from the first gate electrode 131 and may be disposed as a single layer. The first dummy gate electrode 131D may have a region surrounding ends of the first and second separation regions MS1 and MS2, and may have a semicircle or a wavy shape along the ends. The first nitride layer 150L may be in contact with the wavy side surface of the first dummy gate electrode 131D and may extend horizontally. The first nitride layer 150L and the first dummy gate electrode 131D may have a thickness less than that of the first gate electrode 131.

The through plugs 175 may penetrate the first nitride layer 150L and may be spaced apart from the first nitride layer 150L by the first through plug insulating layers 180.

Figure 7A:
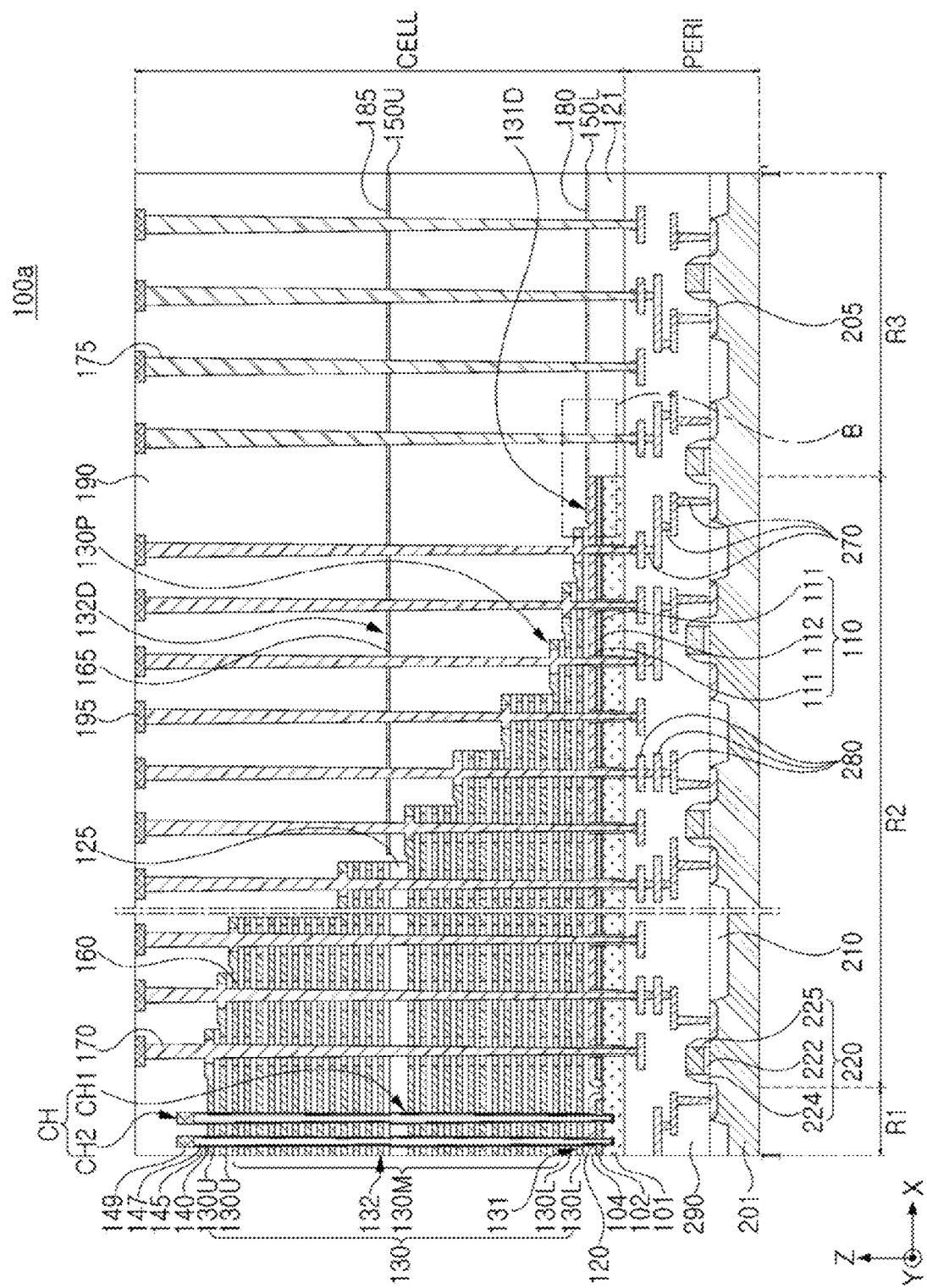
FIGS. 7A and 7B are a cross-sectional view illustrating a semiconductor device and an enlarged view illustrating a portion of a semiconductor device, respectively, according to an example embodiment.
Figure 7B:
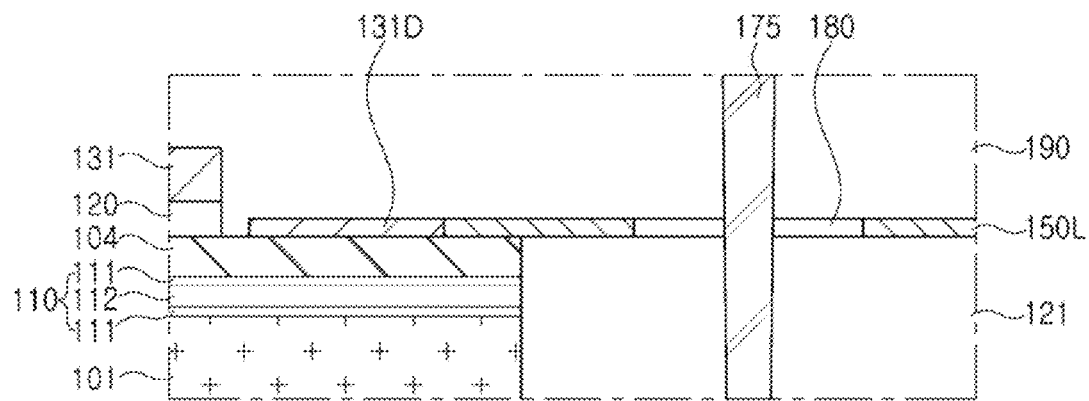

FIGS. 7A and 7B are a cross-sectional view illustrating a semiconductor device and an enlarged view illustrating a portion of a semiconductor device, respectively, according to an example embodiment. FIG. 7B is an enlarged view illustrating region "B" in FIG. 7A.

Referring to FIGS. 7A and 7B, in the semiconductor device 100a, a level on which the first and second nitride layers 150L and 150U are disposed may be different from the example embodiment in FIG. 3A. Accordingly, the levels of the first and second dummy gate electrodes 131D and 132D, the second contact plug insulating layers 165, and the first and second through plug insulating layers 180 and 185 may also be different from the example embodiment in FIG. 3A.

Referring to FIGS. 7A and 7B, the first nitride layer 150L may be disposed on a level lower than a level of a lower surface of the first gate electrode 131. The first nitride layer 150L may be disposed to not overlap the first gate electrode 131 in the x direction. For example, the first nitride layer 150L may be disposed to be in contact with an upper surface of the second horizontal conductive layer 104 and an upper surface of the substrate insulating layer 121. The above-described structure may be formed when a lowermost interlayer insulating layer 120 is removed from an external side of the sacrificial insulating layers 118 during a process of etching the sacrificial insulating layers 118 described below with reference to FIG. 13B.

However, the interlayer insulating layer 120 may not be completely removed and may remain in a relatively small thickness. In this case, the lower surface of the first nitride layer 150L may not be coplanar with the lower surface of the first gate electrode 131, differently from the example embodiment in FIG. 3A, and may be disposed at a level lower than a level of the lower surface of the first gate electrode 131. According to example embodiments, the upper surface of the first nitride layer 150L may be disposed on a level higher than a level of the lower surface of the first gate electrode 131, differently from the illustrated present example embodiment.

Similarly, the second nitride layer 150U may be disposed on a level lower than levels of the upper and lower surfaces of the second gate electrode 132. The second nitride layer 150U may be disposed so as not to overlap the second gate electrode 132 in the x direction. For example, the second nitride layer 150U may be disposed within the cell region insulating layer 190. However, a portion of the interlayer insulating layer 120 may also be described as belonging to the cell region insulating layer 190 depending on a description method, a boundary between the interlayer insulating layer 120 and the cell region insulating layer 190 may be varied. Also, in example embodiments, differently from the example embodiment in FIG. 3A, the lower surface of the second nitride layer 150U may not coplanar with the lower surface of the second gate electrode 132, and may be disposed on a level lower than a level of the lower surface of the second gate electrode 132, and differently from the example embodiment, the upper surface of the second nitride layer 150U may be disposed on a level higher than a level of the lower surface of the second gate electrode 132.

As described above, in example embodiments, the first and second nitride layers 150L and 150U may be disposed on a level corresponding to or lower than a level of each of the first and second gate electrodes 131 and 132, and the specific arrangement level may be varied. Also, in example embodiments, a relative level relationship between the first nitride layer 150L and the first gate electrodes 131 may be different from a relative height relationship between the second nitride layer 150U and the second gate electrodes 132. When a level of the first nitride layer 150L is changed, levels of the first dummy gate electrode 131D and the first through plug insulating layers 180 may also be changed. When a level of the second nitride layer 150U is changed, the levels of the second dummy gate electrode 132D, the second contact plug insulating layers 165, and the second through plug insulating layers 185 may also be changed.

Figure 8:
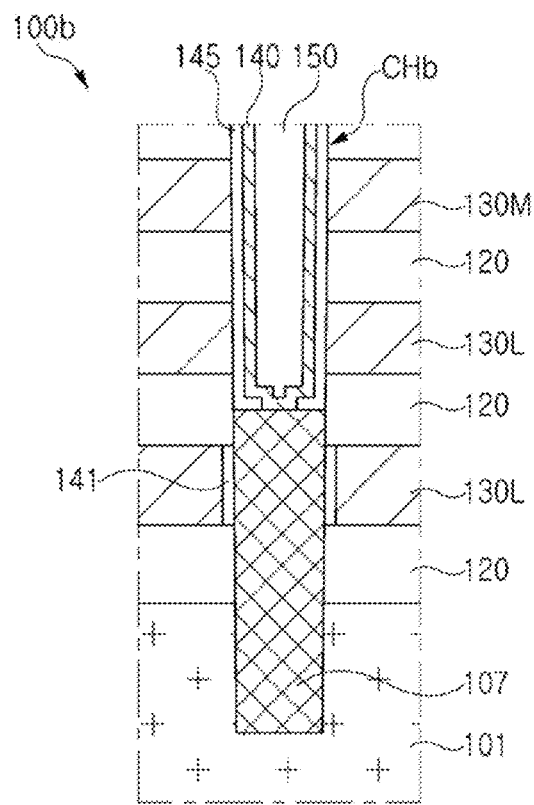
FIG. 8 is an enlarged view illustrating a portion of a semiconductor device according to an example embodiment.

FIG. 8 is an enlarged view illustrating a portion of a semiconductor device according to an example embodiment, illustrating a region corresponding to region "D" in FIG. 3B.

Referring to FIG. 8, in a semiconductor device 100b, a memory cell region CELL may not include the first and second horizontal conductive layers 102 and 104 on the second substrate 101, differently from the example embodiments in FIGS. 3A and 3B. Also, a channel structure CHb may further include an epitaxial layer 107.

The epitaxial layer 107 may be disposed on the second substrate 101 on a lower end of the channel structure CHb, and may be disposed on a side surface of at least one gate electrode 130. The epitaxial layer 107 may be disposed in a recessed region of the second substrate 101. A level of a lower surface of the epitaxial layer 107 may be higher than a level of an upper surface of a lowermost lower gate electrode 130L and may be lower than a level of a lower surface of the lower gate electrode 130L disposed above the lowermost lower gate electrode 130L, but example embodiments are not limited thereto. The epitaxial layer 107 may be connected to the channel layer 140 through an upper surface. A gate insulating layer 141 may be further disposed between the lower gate electrode 130L in contact with the epitaxial layer 107.

Figure 9:
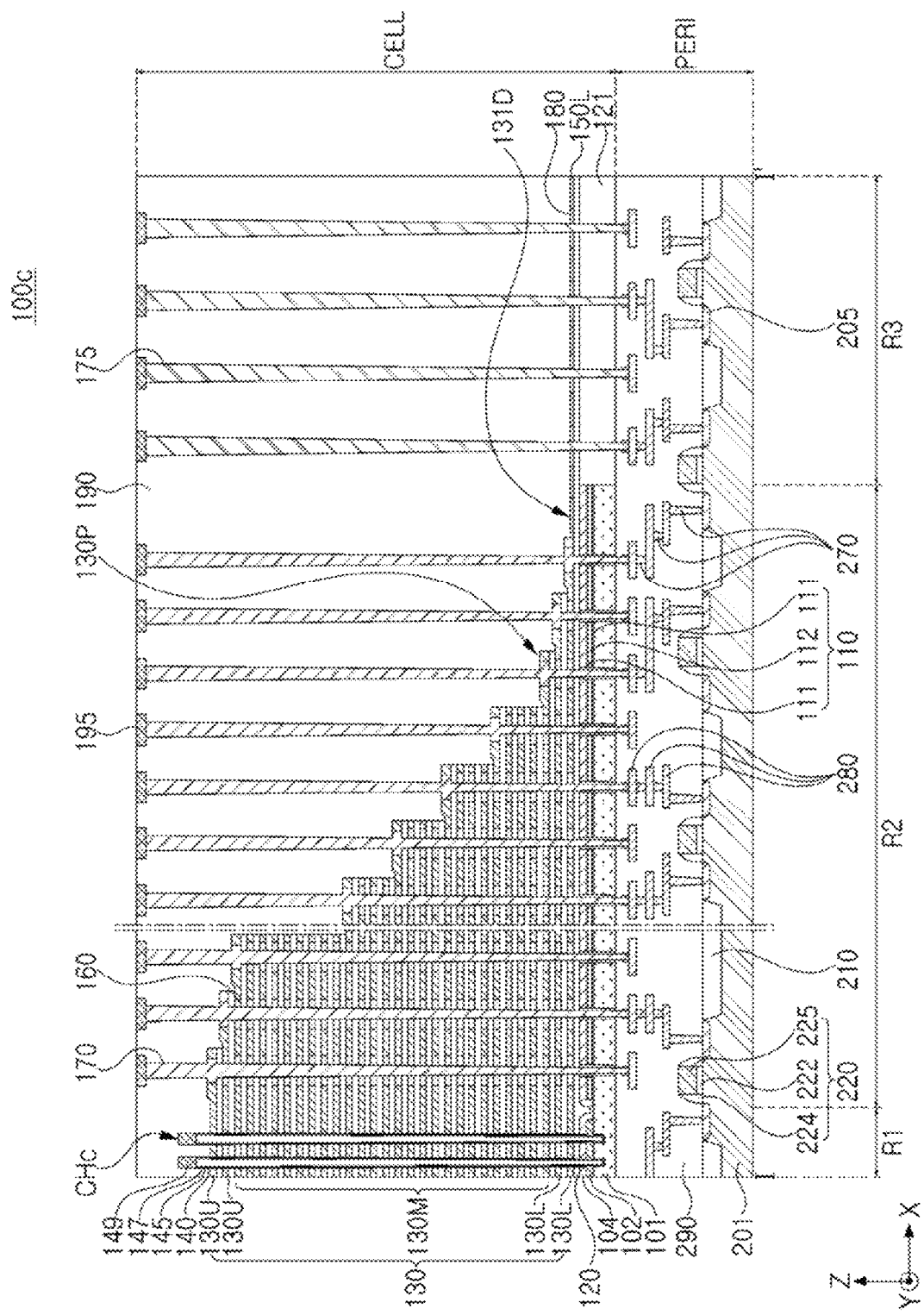
FIG. 9 is a cross-sectional view illustrating a semiconductor device according to an example embodiment.

FIG. 9 is a cross-sectional view illustrating a semiconductor device according to an example embodiment.

Referring to FIG. 9, in a semiconductor device 100c, differently from the example embodiment in FIG. 3A, the second nitride layer 150U, the second dummy gate electrode 132D, the second contact plug insulating layers 165, and the second through plug insulating layers 185 may not be disposed. Also, channel structures CHc may have a form in which a width thereof may gradually change, rather than a form in which upper and lower portions are connected.

Figure 13A:
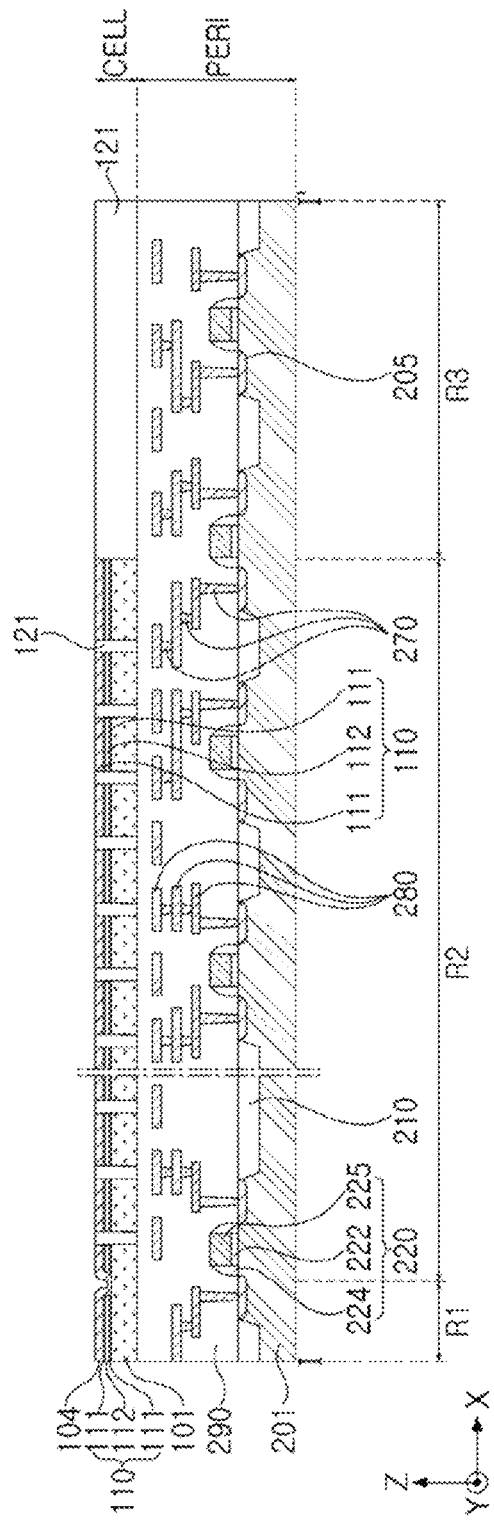
FIGS. 13A to 13K are cross-sectional views illustrating a method of manufacturing a semiconductor device according to an example embodiment.
Figure 13B:
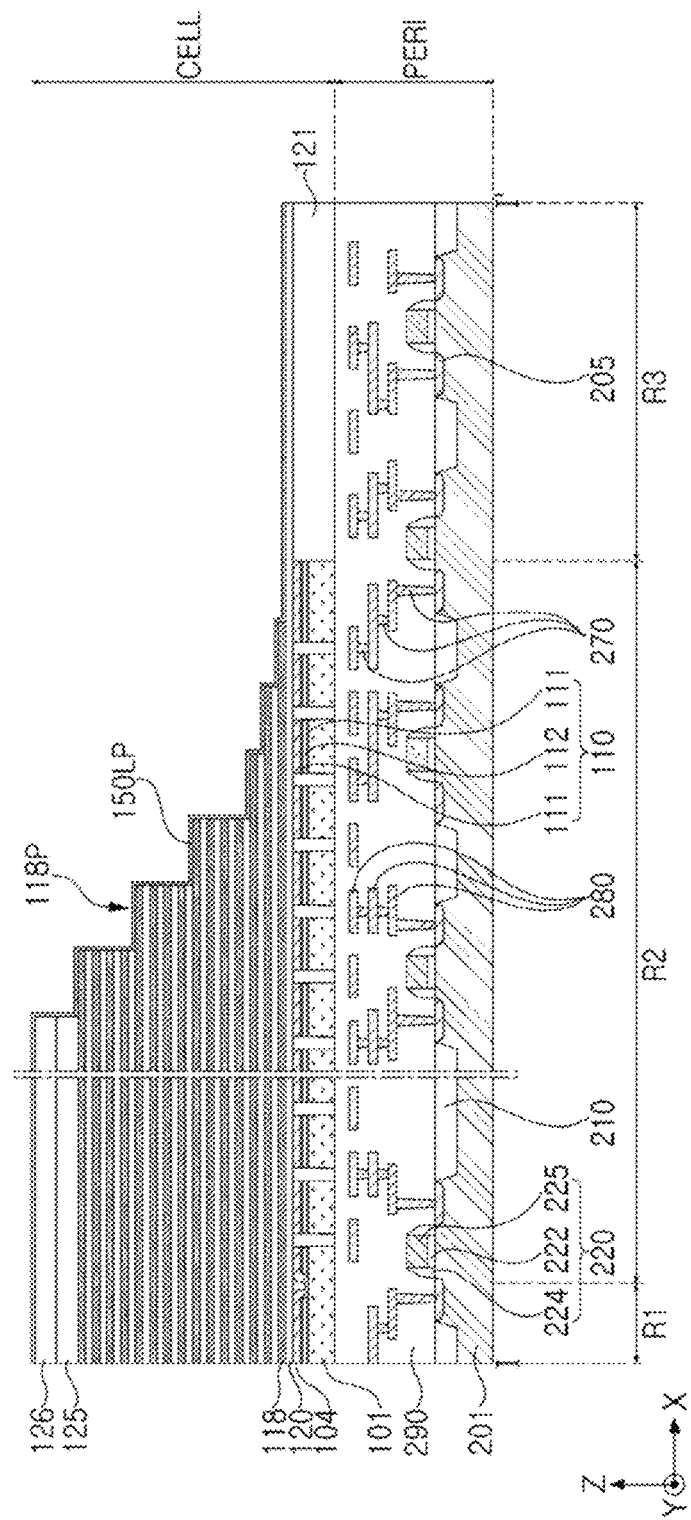
Figure 13C:
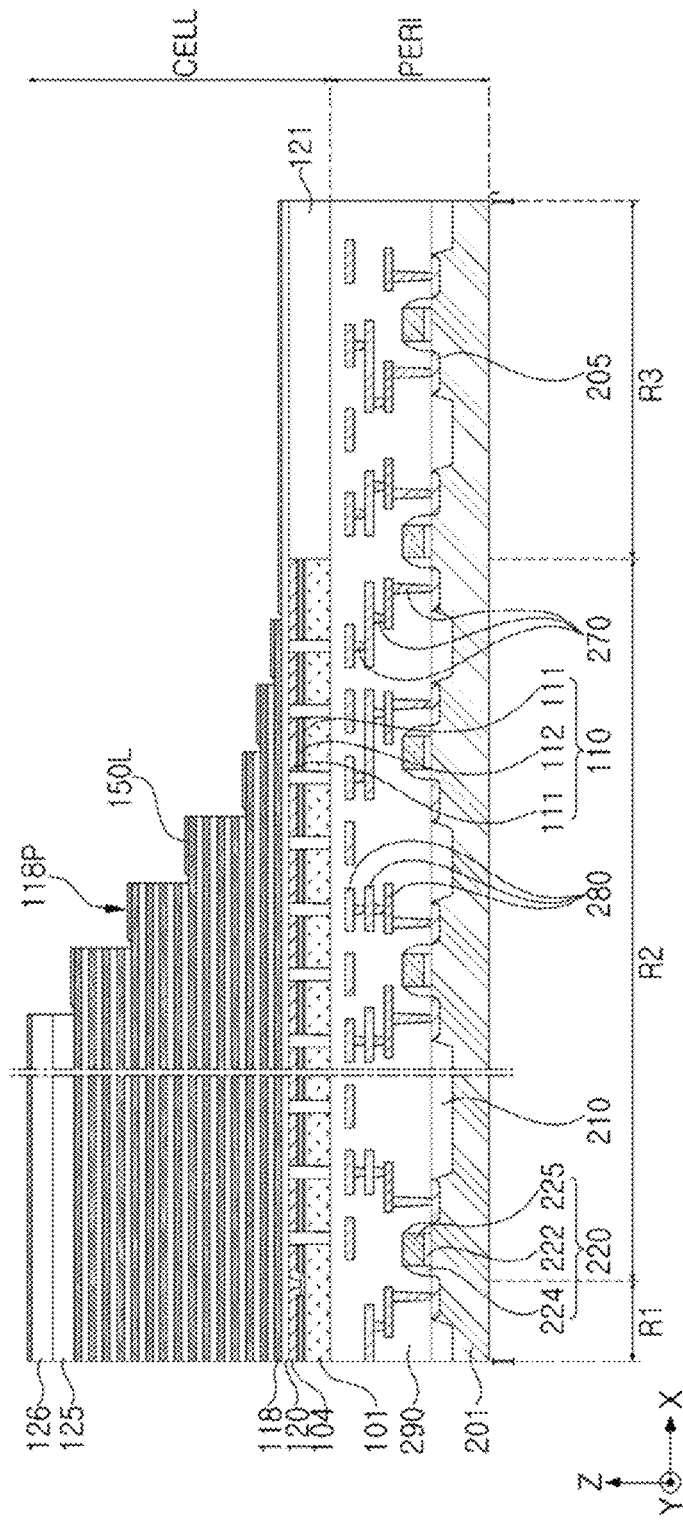
Figure 13D:
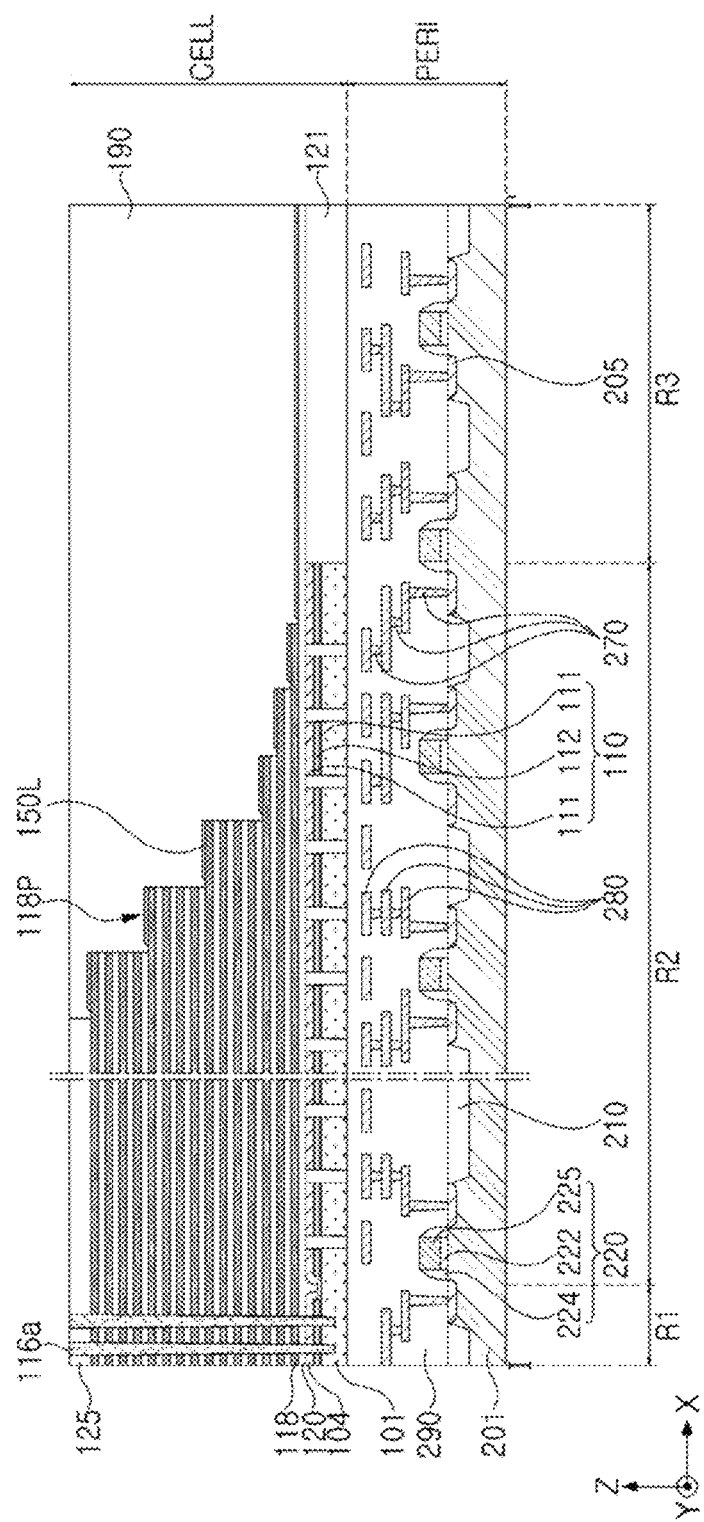
Figure 13E:
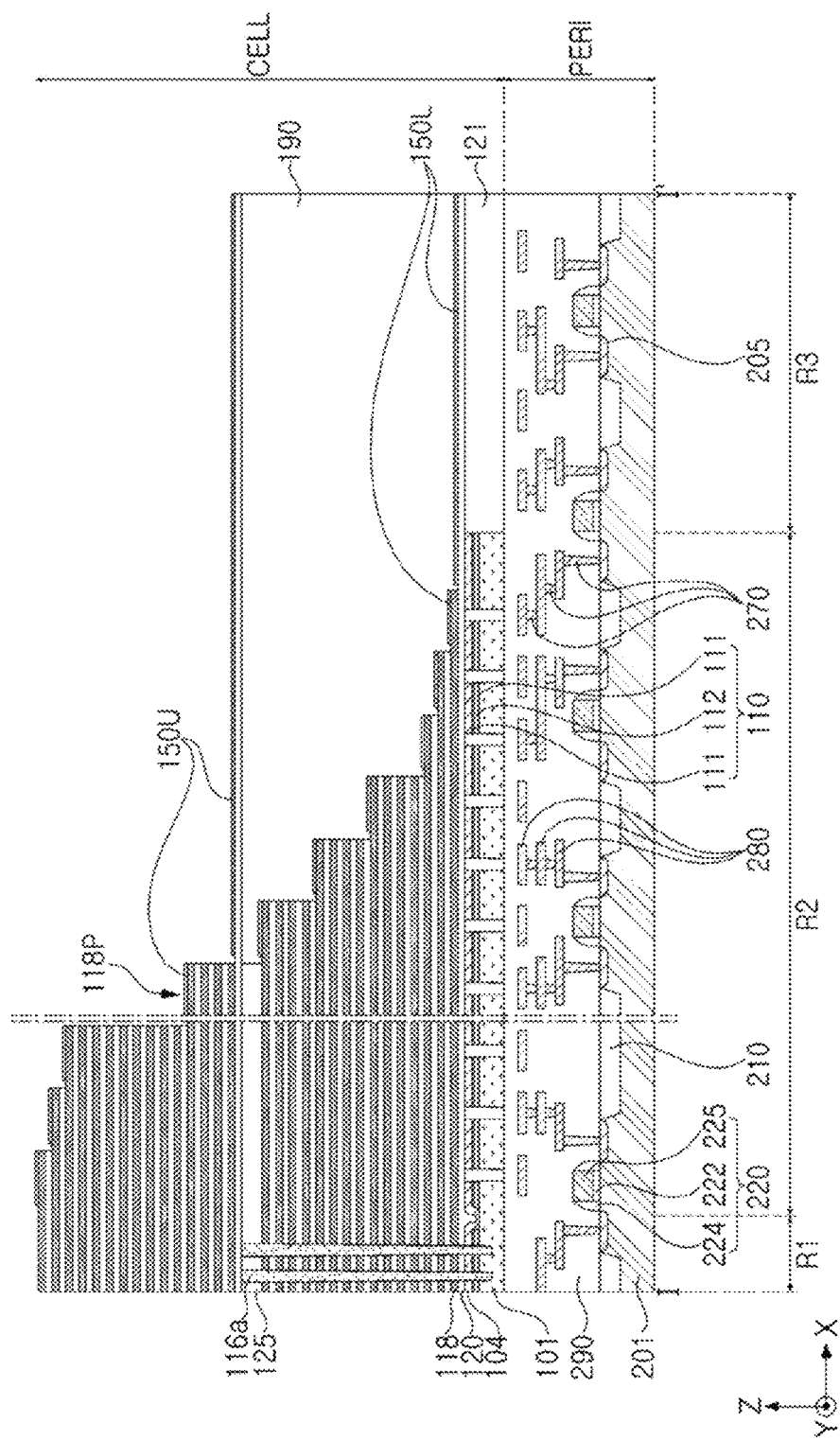

The channel structures CHc in the present example embodiment may be formed by etching the entire lower stack structure and the upper stack structure of the sacrificial insulating layers 118 in FIGS. 13B and 13E in a single process. Accordingly, the nitride layers forming the sacrificial pad regions 118P may not be formed through a plurality of divided processes, and may be formed by a single process. Accordingly, since the second nitride layer 150U is not separately formed, the second dummy gate electrode 132D, the second contact plug insulating layers 165, and the second through plug insulating layers 185 may be not formed. However, even in this case, the first nitride layer 150L, the first dummy gate electrode 131D, and the first through plug insulating layers 180 may be disposed on a level corresponding to or similar to a level of the first gate electrode 131.

Figure 10:
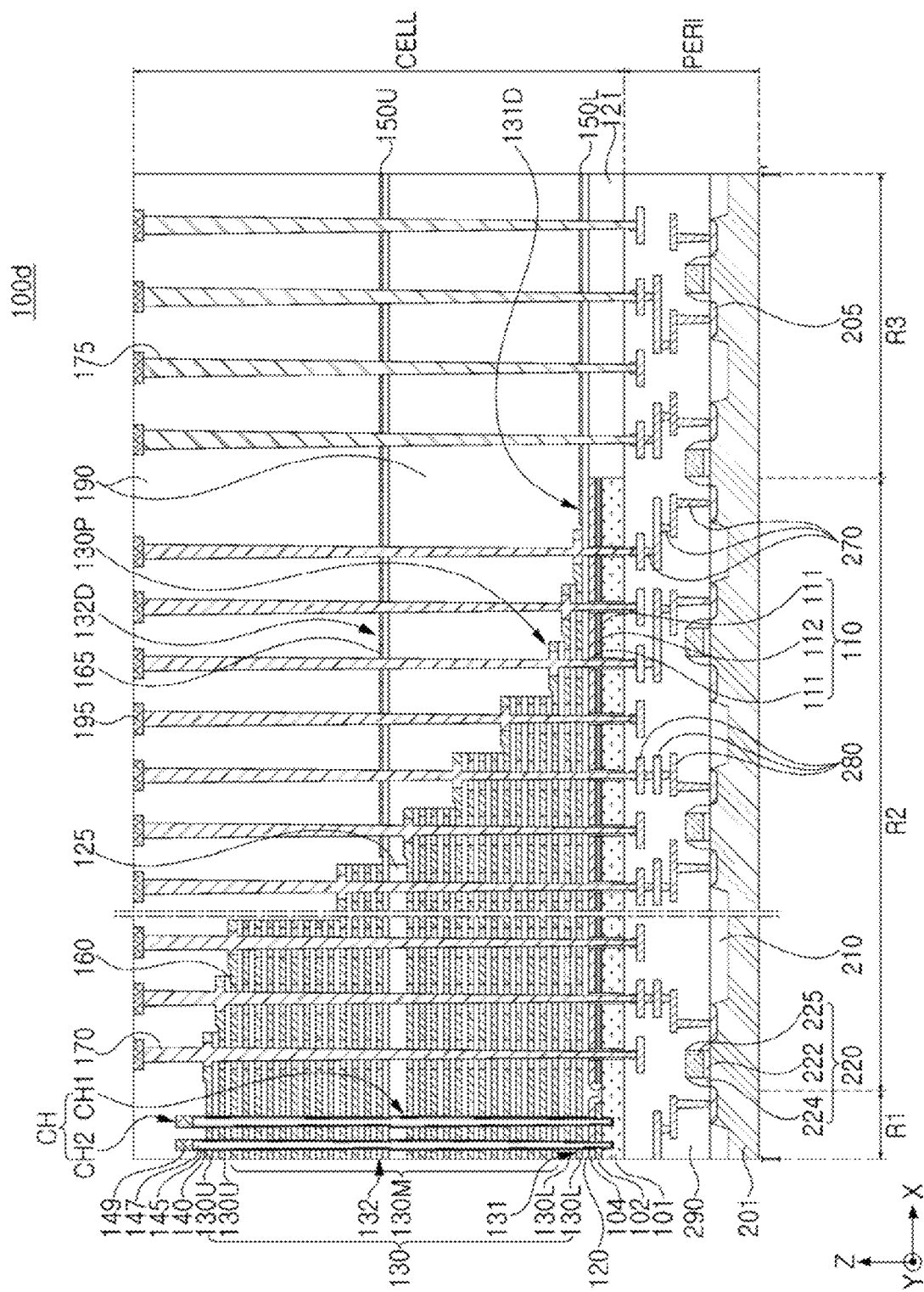
FIG. 10 is a cross-sectional view illustrating a semiconductor device according to an example embodiment.

FIG. 10 is a cross-sectional view illustrating a semiconductor device according to an example embodiment.

Referring to FIG. 10, in a semiconductor device 100d, differently from the example embodiment in FIG. 3A, the first and second through plug insulating layers 180 and 185 surrounding the through plugs 175 may not be disposed. The through plugs 175 may penetrate the first and second nitride layers 150L and 150U in addition to the cell region insulating layer 190 and may include a region surrounded by the first and second nitride layers 150L and 150U. This structure may be manufactured by forming the through plugs 175 in a process separate from a process of forming the contact plugs 170. Accordingly, even in this case, a portion of the contact plugs 170 may have a region surrounded by the second contact plug insulating layers 165.

Figure 11:
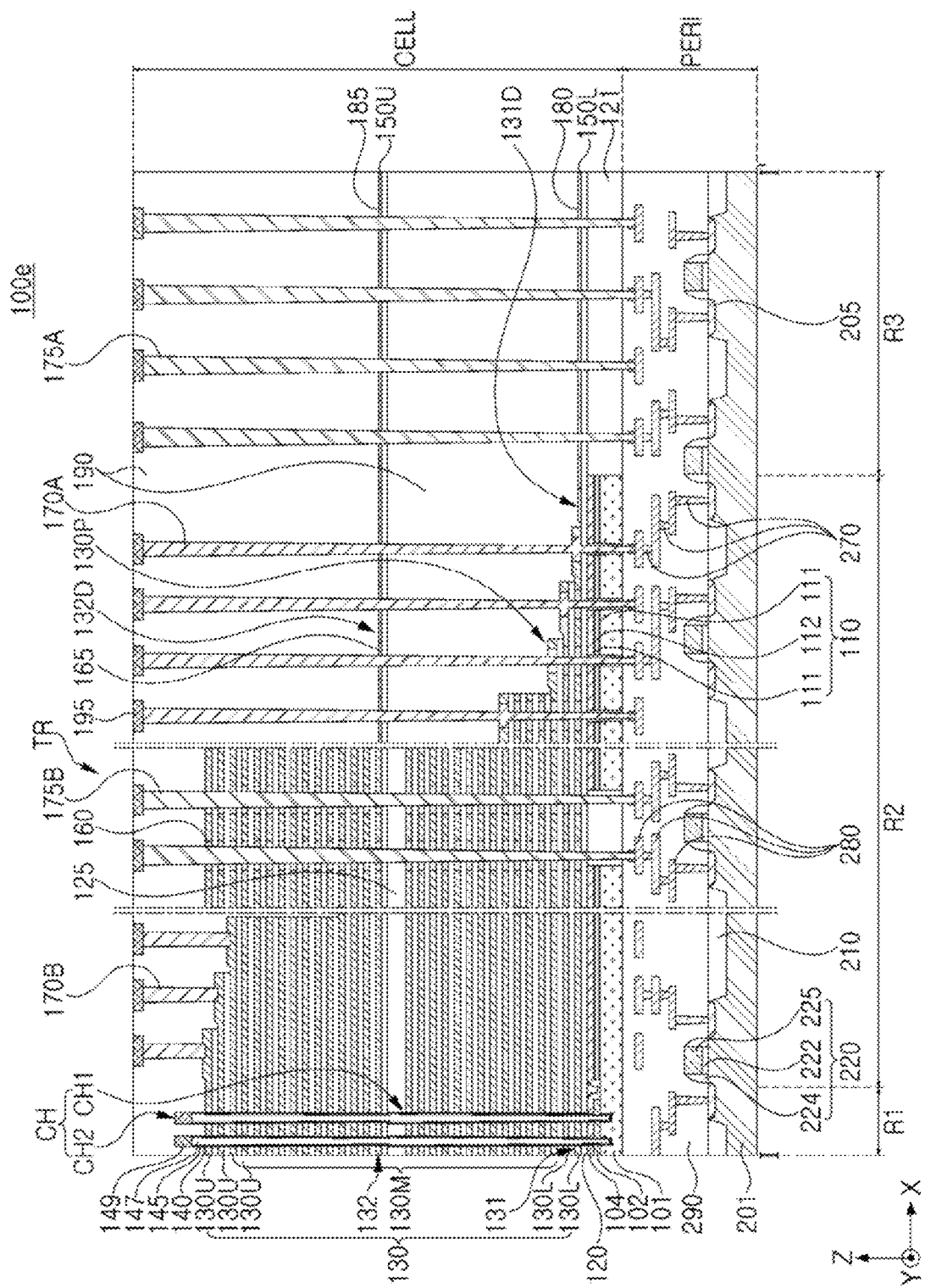
FIG. 11 is a cross-sectional view illustrating a semiconductor device according to an example embodiment.

FIG. 11 is a cross-sectional view illustrating a semiconductor device according to an example embodiment.

Referring to FIG. 11, in a semiconductor device 100e, a memory cell region CELL may further include a through interconnection region TR. The through interconnection region TR may correspond to the second through interconnection region TR2 in FIG. 1, and the first through interconnection region TR1 may have the same or similar structure. In addition to the first through plugs 175A, the memory cell region CELL may further include second through plugs 175B disposed in the through interconnection region TR. Also, the second contact plugs 170B connected to the upper gate electrodes 130U may have a shape different from a shape of the other first contact plugs 170A.

The through interconnection region TR may include second through plugs 175B penetrating the second substrate 101 from an upper portion of the memory cell region CELL and extending in the z direction. The second through plugs 175B may have the same shape as that of the first through plugs 175A, and may not be connected to the gate electrodes 130. The entire gate electrodes 130 may be disposed up to the uppermost upper gate electrode 130U in the through interconnection region TR, and the uppermost upper gate electrode 130U may not have a pad region 130P in the through interconnection region TR. Thus, the uppermost upper gate electrode 130U may not have an increased thickness. The second through plugs 175B may be separated from the gate electrodes 130 by the first contact plug insulating layer 160. The through interconnection region TR may be formed by performing a process to prevent the second nitride layer 150U from remaining during the manufacturing process. However, the second nitride layer 150U may not be removed by a separate process, and may be removed using a layer used for stop etching when a stepped portion is formed.

Differently from the first contact plugs 170A, the second contact plugs 170B may be disposed to be connected to the upper gate electrodes 130U in the pad region 130P and to not penetrate the upper gate electrodes 130U. The second contact plugs 170B may be disposed to be partially recessed into the upper gate electrodes 130U or may be disposed to be in contact with the upper surfaces of the upper gate electrodes 130U.

Figure 12:
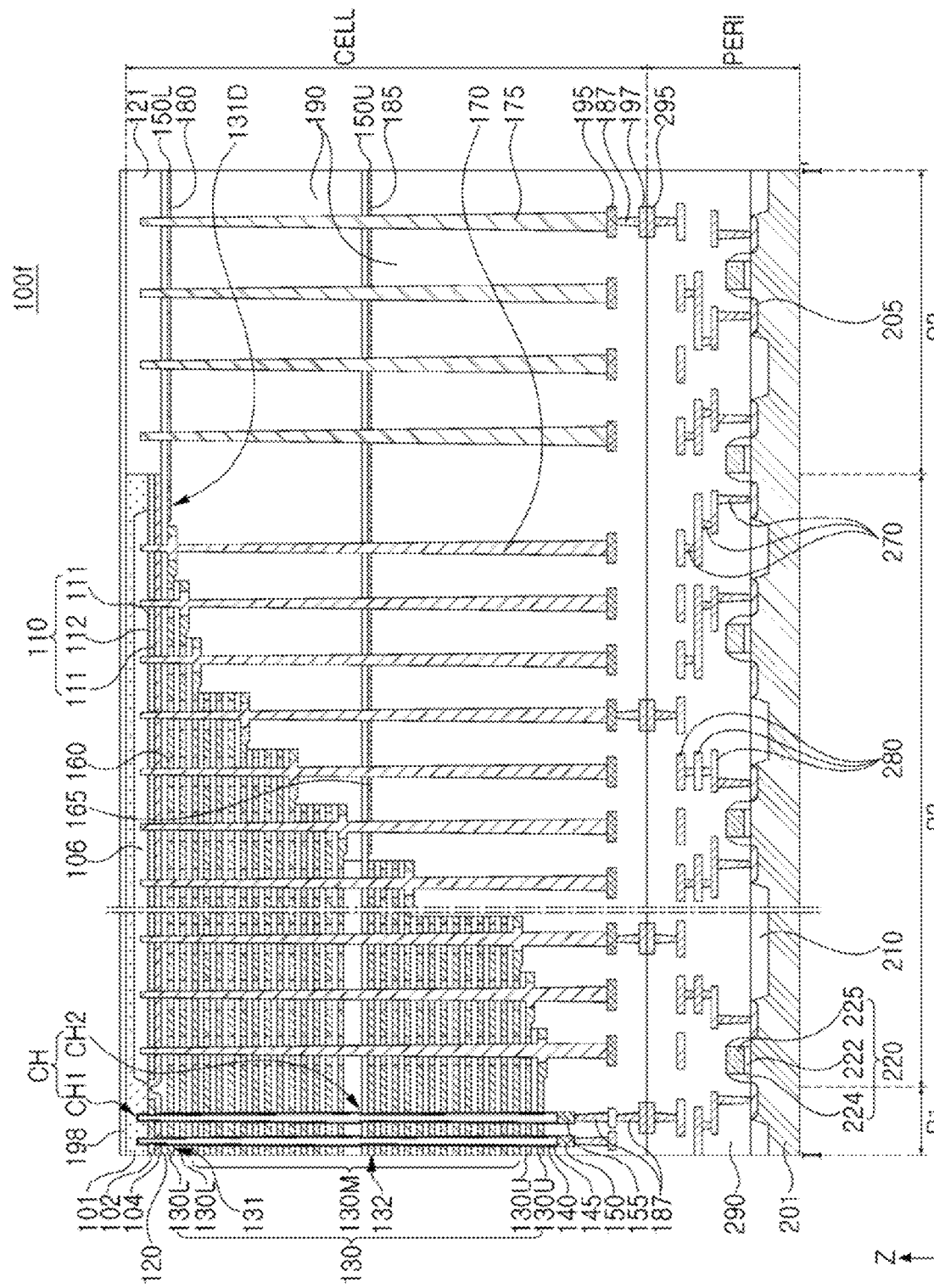
FIG. 12 is a cross-sectional view illustrating a semiconductor device according to an example embodiment.

FIG. 12 is a cross-sectional view illustrating a semiconductor device according to an example embodiment.

Referring to FIG. 12, a semiconductor device 100f may have a structure in which a peripheral circuit region PERI may be vertically bonded to a memory cell region CELL. In the present example embodiment, the peripheral circuit region PERI may further include first bonding metal layers 295, and the memory cell region CELL may further include upper plugs 187, second bonding metal layers 197, and a passivation layer 198 on the second substrate 101. Also, upper ends of the contact plugs 170 and the through plugs 175 may be disposed in the second substrate 101 and the substrate insulating layer 121, respectively.

The first bonding metal layers 295 may be disposed on the circuit contact plugs 270 and the circuit interconnection lines 280 and an upper surface thereof may be exposed to an upper surface of the peripheral circuit region PERI through the peripheral region insulating layer 290. The second bonding metal layers 197 may be disposed below the upper plugs 187, and a lower surface thereof may be exposed to a lower surface of the memory cell region CELL through the cell region insulating layer 190. The first bonding metal layers 295 and the second bonding metal layers 197 may include a conductive material, such as copper (Cu), for example. In some example embodiments, each of the peripheral region insulating layer 290 and the cell region insulating layer 190 may include a bonding dielectric layer surrounding the first bonding metal layers 295 and the second bonding metal layers 197, respectively and disposed at a predetermined depth from an upper surface. The bonding dielectric layer may include, e.g., at least one of SiO, SiN, SiCN, SiOC, SiON, and SiOCN. The passivation layer 198 may be disposed on the second substrate 101 to protect the second substrate 101 and may include an insulating material.

The peripheral circuit region PERI and the memory cell region CELL may be bonded by bonding the first bonding metal layers 295 to the second bonding metal layers 197 and bonding the bonding dielectric layers to each other. The bonded first bonding metal layers 295 and second bonding metal layers 197 may be, e.g., copper (Cu)-copper (Cu) bonding. The bonded bonding dielectric layers may be bonded to each other by dielectric-dielectric bonding, and may be, e.g., SiCN—SiCN bonded layers. The peripheral circuit region PERI and the memory cell region CELL may be bonded by hybrid bonding including copper (Cu)-copper (Cu) bonding and dielectric-dielectric bonding.

Upper ends of the contact plugs 170 may be disposed to be electrically separated from each other in the second substrate 101. In the present example embodiment, the second substrate 101 may include an insulating region 106, and upper ends of the contact plugs 170 may be disposed in the insulating region 106. However, the second substrate 101 may have a divided form to electrically separate the contact plugs 170 from each other, instead of including the insulating region 106.

FIGS. 13A to 13K are cross-sectional views illustrating a method of manufacturing a semiconductor device according to an example embodiment.

Referring to FIG. 13A, a peripheral circuit region PERI including circuit devices 220 and lower interconnection structures may be formed on a first substrate 201, a second substrate 101 on which the memory cell region CELL is provided, a horizontal insulating layer 110, a second horizontal conductive layer 104, and a substrate insulating layer 121 may be formed above the peripheral circuit region PERI.

Device separation layers 210 may be formed in the first substrate 201, and the circuit gate dielectric layer 222 and the circuit gate electrode 225 may be formed in order on the first substrate 201. The device separation layers 210 may be formed by, e.g., a shallow trench separation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polysilicon or metal silicide layers, but example embodiments are not limited thereto. Thereafter, a spacer layer 224 and source/drain regions 205 may be formed on both sidewalls of the circuit gate dielectric layer 222 and the circuit gate electrode 225. In some example embodiments, the spacer layer 224 may be formed of a plurality of layers. Thereafter, the source/drain regions 205 may be formed by performing an ion implantation process.

Among the lower interconnection structures, the circuit contact plugs 270 may be formed by partially forming the peripheral region insulating layer 290, removing a portion thereof by etching, and filling a conductive material. The circuit interconnection lines 280 may be formed by depositing a conductive material and patterning the conductive material.

The peripheral region insulating layer 290 may include a plurality of insulating layers. The peripheral region insulating layer 290 may be partially formed in each process of forming the lower interconnection structures and may be partially formed on the uppermost circuit interconnection line 280, such that the peripheral region insulating layer 290 may be formed to cover the circuit devices 220 and the lower interconnection structures.

Thereafter, the second substrate 101 may be formed on the peripheral region insulating layer 290. The second substrate 101 may be formed of, e.g., polycrystalline silicon, and may be formed by a CVD process. Polycrystalline silicon forming the second substrate 101 may include impurities.

The first and second horizontal insulating layers 111 and 112 forming the horizontal insulating layer 110 may be alternately stacked on the second substrate 101. The horizontal insulating layer 110 may be partially replaced with the first horizontal conductive layer 102 in FIG. 3A through a subsequent process. The first horizontal insulating layers

111 may include a material different from a material of the second horizontal insulating layer 112. For example, the first horizontal insulating layers 111 may be formed of the same material as a material of the interlayer insulating layers 120, and the second horizontal insulating layer 112 may be formed of the same material as a material of the subsequent sacrificial insulating layers 118. Partial regions of the horizontal insulating layer 110 may be removed by a patterning process, e.g., in the second region R2 of the second substrate 101.

The second horizontal conductive layer 104 may be formed on the horizontal insulating layer 110 and may be in contact with the second substrate 101 in a region from which the horizontal insulating layer 110 is removed. Accordingly, the second horizontal conductive layer 104 may be bent along ends of the horizontal insulating layer 110, may cover the ends and may extend onto the second substrate 101.

The substrate insulating layer 121 may penetrate the second substrate 101 in regions in which the contact plugs 170 (see FIG. 3A) of the second region R2 are disposed and in the third region R3. The substrate insulating layer 121 may be formed by removing a portion of the second substrate 101, the horizontal insulating layer 110, and the second horizontal conductive layer 104 and filling an insulating material. After filling the insulating material, a planarization process may be further performed using a chemical mechanical polishing (CMP) process. Accordingly, an upper surface of the substrate insulating layer 121 may be substantially coplanar with an upper surface of the second horizontal conductive layer 104.

Referring to FIG. 13B, sacrificial insulating layers 118 and interlayer insulating layers 120 forming a lower stack structure may be alternately stacked on the second horizontal conductive layer 104, a stepped structure may be formed, and a first preliminary nitride layer 150LP may be formed.

In this process, the sacrificial insulating layers 118 and the interlayer insulating layers 120 may be formed in a region on a level on which the first channel structures CH1 (see FIG. 3A) are disposed. An upper interlayer insulating layer 125 having a relatively great thickness may be formed on an uppermost portion, and an etch stop layer 126 may be formed above the upper interlayer insulating layer 125. The sacrificial insulating layers 118 may be replaced with the gate electrodes 130 (see FIG. 3A) through a subsequent process. The sacrificial insulating layers 118 may be formed of a material different from that of the interlayer insulating layers 120, and may be formed of a material etched with etch selectivity for the interlayer insulating layers 120 under predetermined etching conditions. For example, the interlayer insulating layer 120 and the upper interlayer insulating layer 125 may be formed of at least one of silicon oxide and silicon nitride, and the sacrificial insulating layers 118 may be formed of a material different from that of the interlayer insulating layer 120, selected from among silicon, silicon oxide, silicon carbide, and silicon nitride. In some example embodiments, the interlayer insulating layers 120 may not have the same thickness. Also, the thicknesses of the interlayer insulating layers 120 and the sacrificial insulating layers 118 and the number of layers thereof may be varied from the illustrated example. The etch stop layer 126 may be a layer for protecting a structure disposed below when a stepped structure is formed, and may be referred to as a hard mask layer.

Thereafter, in the second region R2, a photolithography process and an etching process may be repeatedly performed on the sacrificial insulating layers 118 using a mask layer such that the upper sacrificial insulating layers 118 may extend less than the lower sacrificial insulating layers 118. Accordingly, the sacrificial insulating layers 118 may form a stepped structure by a predetermined unit, and sacrificial pad regions 118P disposed on an uppermost portion of the sacrificial insulating layers 118 may be exposed upwardly. The first nitride layer 150L in the example embodiment of FIGS. 7A and 7B may be formed by forming the lowermost interlayer insulating layer 120 to extend by the same length as that of the sacrificial insulating layer 118 disposed above the lowermost interlayer insulating layer 120.

Thereafter, a first preliminary nitride layer 150LP may be formed on the lower stack structure. The first preliminary nitride layer 150LP may, along the staircase shape of the lower stack structure, cover the exposed sacrificial pad regions 118P, may cover side surfaces of the staircase of the lower stack structure, and may extend into the lowermost interlayer insulating layer 120. A thickness of the first preliminary nitride layer 150LP may range from about 50% to about 110% of a thickness of the sacrificial insulating layers 118, but example embodiments are not limited thereto.

Referring to FIG. 13C, the first nitride layer 150L may be formed by partially removing the first preliminary nitride layer 150LP to remain only on the sacrificial pad regions 118P.

The first preliminary nitride layer 150LP may be selectively removed from side surfaces of the staircase of the lower stack structure. The removing process may be performed after changing physical properties of horizontally deposited regions of the first preliminary nitride layer 150LP using plasma, for example. Accordingly, the first preliminary nitride layer 150LP may remain on the sacrificial pad regions 118P and the lowermost interlayer insulating layer 120 and may form the first nitride layer 150L. On the lowermost interlayer insulating layer 120, the first nitride layer 150L may be spaced apart from adjacent sacrificial pad region 118P.

In the present example embodiment, a process for removing the first nitride layer 150L from an external side of the lower stack structure may not be performed, thereby simplifying the process and improving productivity. Accordingly, the first nitride layer 150L on the lowermost interlayer insulating layer 120 may remain in a portion of the second region R2 and the third region R3 and may be included in the semiconductor device 100.

Referring to FIG. 13D, first channel sacrificial layers 116a penetrating the lower stack structure may be formed.

First, a portion of the cell region insulating layer 190 covering the lower stack structure of the sacrificial insulating layers 118 and the interlayer insulating layers 120 may be formed, and the etch stop layer 126 may be removed by a planarization process.

Thereafter, the first channel sacrificial layers 116a may be formed in a region corresponding to the first channel structures CH1 (see FIG. 3A) in the first region R1. The first channel sacrificial layers 116a may be formed by forming lower channel holes to penetrate the lower stack structure, and depositing a material forming the first channel sacrificial layers 116a in the lower channel holes. The first channel sacrificial layers 116a may include, e.g., polycrystalline silicon.

Referring to FIG. 13E, the sacrificial insulating layers 118 and the interlayer insulating layers 120 forming an upper stack structure may be alternately stacked on the lower stack structure, a stepped structure may be formed, and a second nitride layer 150U may be formed.

In this process, in the upper region on a level on which the second channel structures CH2 (see FIG. 3A) is disposed, the process for the lower stack structure described above with reference to FIGS. 13B and 13C may be performed in the same manner. Accordingly, the second nitride layer 150U may remain only on the sacrificial pad regions 118P and on the lowermost interlayer insulating layer 120 of the upper stack structure. Also, on the lowermost interlayer insulating layer 120 of the upper stack structure, the second nitride layer 150U may be spaced apart from an adjacent sacrificial pad region 118P. The second nitride layer 150U in the example embodiment of FIGS. 7A and 7B may be formed by forming the lowermost interlayer insulating layer 120 of the upper stack structure to extend by the same length as that of the sacrificial insulating layer 118 disposed above the lowermost interlayer insulating layer 120.

In the present example embodiment, a process for removing the second nitride layer 150U from an external side of the upper stack structure may not be performed, thereby simplifying the process and improving productivity. Accordingly, the second nitride layer 150U on the lowermost interlayer insulating layer 120 of the upper stack structure may remain in a portion of the second region R2 and the third region R3 and may be included in the semiconductor device 100.

Figure 13F:
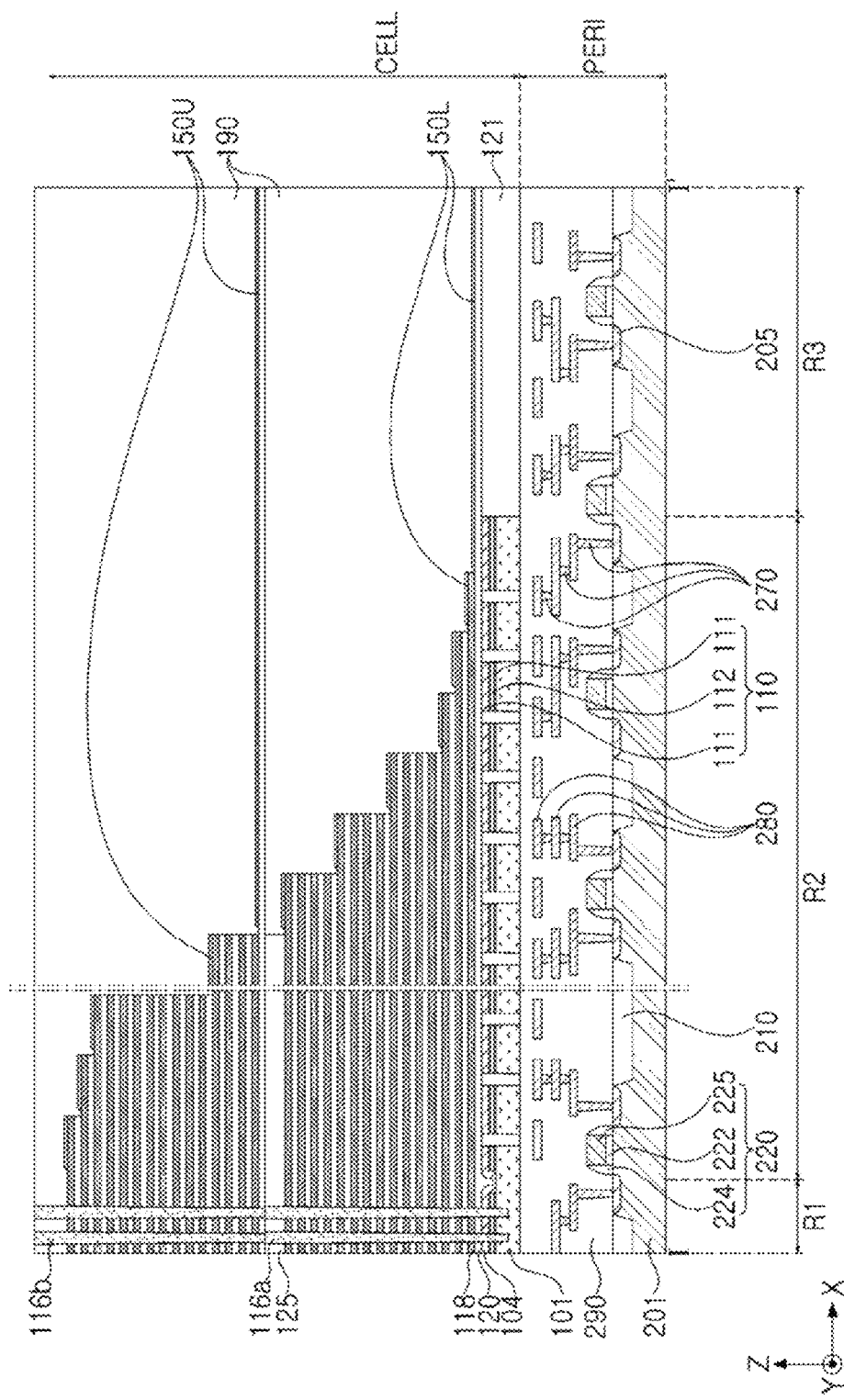

Referring to FIG. 13F, second channel sacrificial layers 116b penetrating the upper stack structure may be formed.

A portion of the cell region insulating layer 190 covering the upper stack structure of the sacrificial insulating layers 118 and the interlayer insulating layers 120 may be formed.

Thereafter, the second channel sacrificial layers 116b may be formed by forming upper channel holes to penetrate the upper stack structure and to expose upper ends of the first channel sacrificial layers 116a and depositing a material forming the second channel sacrificial layers 116b in the upper channel holes. The second channel sacrificial layers 116b may include, e.g., polycrystalline silicon.

Figure 13G:
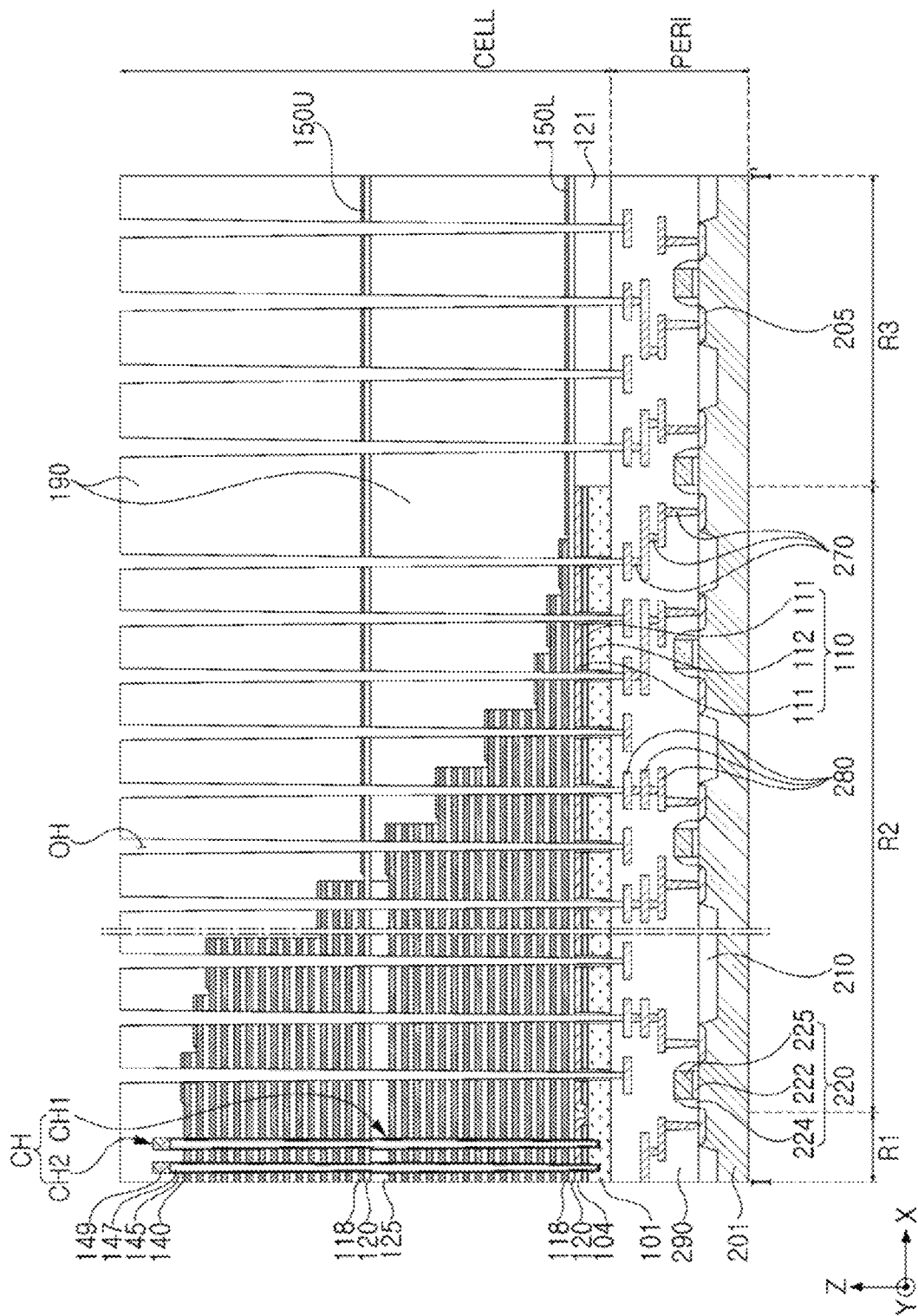

Referring to FIG. 13G, the first and second sacrificial channel layers 116a and 116b may be removed, the channel structures CH may be formed, and openings OH may be formed.

In the upper stack structure, an upper separation region SS (see FIG. 3B) may be formed by removing a portion of the sacrificial insulating layers 118 and the interlayer insulating layers 120. To form the upper separation region SS, a region in which the upper separation region SS is to be formed may be exposed using a mask layer, a predetermined number of the sacrificial insulating layers 118 and the interlayer insulating layers 120 may be removed, an insulating material may be deposited, thereby forming the upper separation insulating layer 103 (see FIG. 3B).

The channel structures CH may be formed by forming channel holes by removing the first and second sacrificial channel layers 116a and 116b and filling the channel holes. For example, the channel structures CH may be formed by forming a gate dielectric layer 145, a channel layer 140, a channel filling insulating layer 147, and a channel pad 149 in order in the channel holes. In this process, at least a portion of the gate dielectric layer 145 extending vertically along the channel layer 140 may be formed. The channel layer 140 may be formed on the gate dielectric layer 145 in the channel structures CH. The channel filling insulating layer 147 may be formed to fill the channel structures CH, and may be an insulating material. The channel pads 149 may be formed of a conductive material, such as polycrystalline silicon, for example.

The openings OH may be formed in a region in which the contact plugs 170 and the through plugs 175 in FIG. 3A are to be formed. Before the openings OH are formed, a portion of the cell region insulating layer 190 covering the channel structures CH may be further formed. The openings OH may have a cylindrical hole shape, may penetrate the substrate insulating layer 121, and may extend to the peripheral circuit region PERI. Although not specifically illustrated, the openings OH may be formed to expose the pad layers 285 (see FIG. 4C) on the circuit interconnection lines 280. A portion of the openings OH may extend by penetrating the first and second nitride layers 150L and 150U.

Figure 13H:
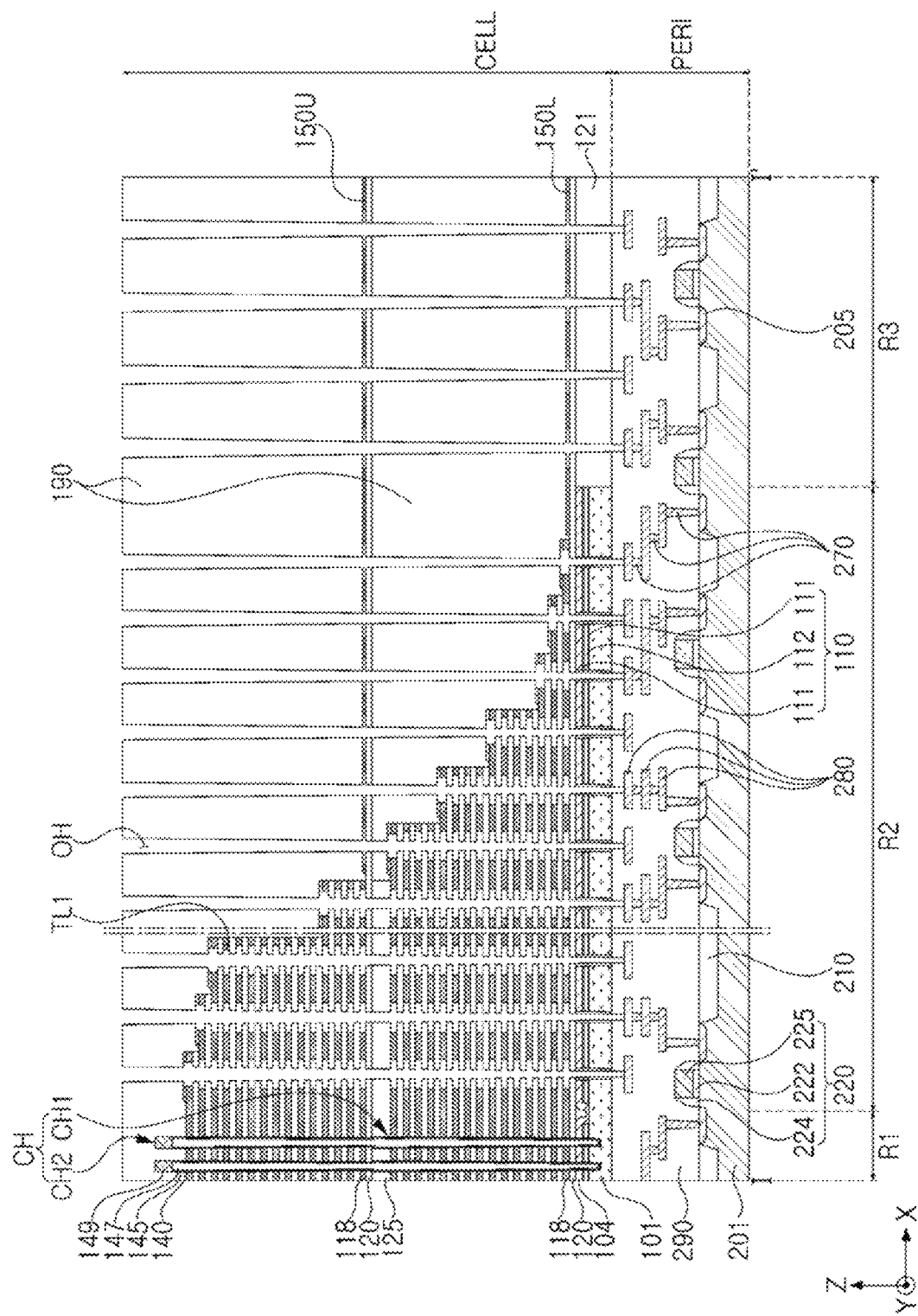

Referring to FIG. 13H, the sacrificial insulating layers 118 and the first and second nitride layers 150L and 150U exposed through the openings OH may be partially removed.

By providing an etchant through the openings OH, the sacrificial insulating layers 118 and the first and second nitride layers 150L and 150U may be removed from a circumference of the openings OH by a predetermined length, thereby forming first tunnel portions TL1. The first tunnel portions TL1 may be formed to have a relatively short length in the sacrificial pad regions 118P, and may be formed to have a relatively long length in the sacrificial insulating layers 118 disposed below the sacrificial pad regions 118P.

For example, at first, the first tunnel portions TL1 may be formed relatively long in the sacrificial pad regions 118P, which may be because an etching rate of the first and second preliminary nitride layers 150LP and 150UP may be relatively higher than an etching rate of etching the sacrificial insulating layers 118. Thereafter, a sacrificial layer may be formed in the openings OH and the first tunnel portions TL1. The sacrificial layer may be formed of a material having an etching rate slower than those of the first and second preliminary nitride layers 150LP and 150UP and the sacrificial insulating layers 118. Thereafter, a portion of the sacrificial layer and the sacrificial insulating layers 118 may be removed. In this case, the sacrificial layer may remain in an uppermost portion, and in a lower portion, the sacrificial layer may be removed and portions of the sacrificial insulating layers 118 may be removed. Accordingly, the first tunnel portions TL1 may be formed to have a relatively short length in the sacrificial pad regions 118P.

Figure 13I:
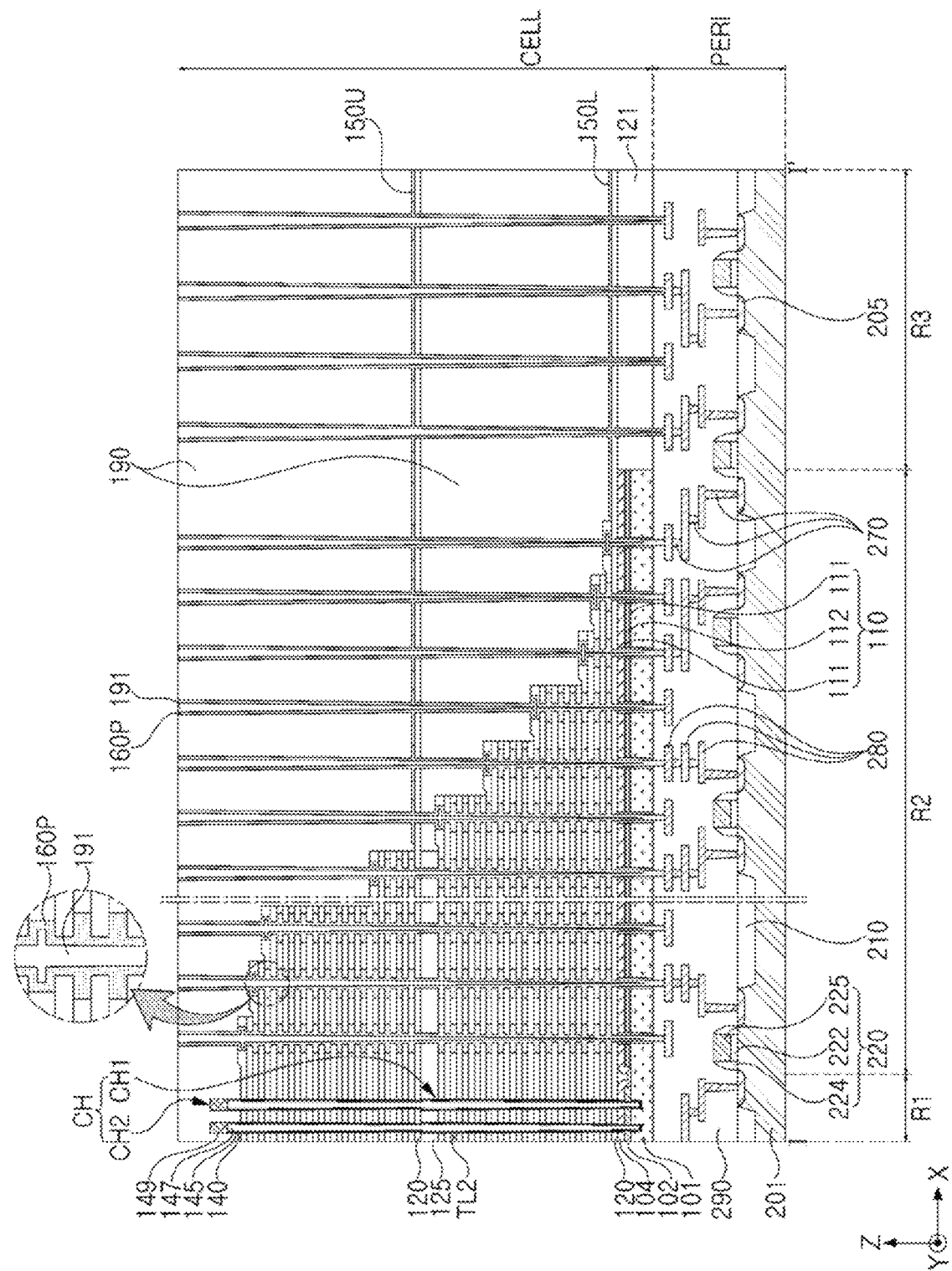

Referring to FIG. 13I, the first tunnel portions TL1 and the openings OH may be filled with preliminary contact plug insulating layers 160P and vertical sacrificial layers 191, the sacrificial insulating layers 118 may be removed, thereby forming second tunnel portions TL2.

The preliminary contact plug insulating layers 160P may remain in a subsequent process, and may form the first and second contact plug insulating layers 160 and 165 and the first and second through plug insulating layers 180 and 185. The preliminary contact plug insulating layers 160P may be deposited by, e.g., an ALD process. The preliminary contact plug insulating layers 160P may not completely fill the first tunnel portions TL1 in an uppermost region of each of the stepped regions having a relatively great thickness, a region from which the sacrificial pad regions 118P are partially removed, and may completely fill the first tunnel portions TL1 in a lower region and the region form which the first and second nitride layers 150L and 150U are removed.

The vertical sacrificial layers 191 may be formed to fill the remaining space in the openings OH. The vertical sacrificial layers 191 may include a material different from that of the preliminary contact plug insulating layers 160P, and may include, e.g., polycrystalline silicon.

Thereafter, openings penetrating the sacrificial insulating layers 118 and the interlayer insulating layers 120 and extending toward the second substrate 101 may be formed in the positions of the first and second separation regions MS1 and MS2 (see FIG. 2).

By forming sacrificial spacer layers in the openings and performing an etch-back process, the horizontal insulating layer 110 may be selectively removed from the first region R1 and a portion of the exposed gate dielectric layer 145 may also be removed. The first horizontal conductive layer 102 may be formed by depositing a conductive material in the region from which the horizontal insulating layer 110 is removed, and the sacrificial spacer layers may be removed from the openings. By this process, the first horizontal conductive layer 102 may be formed in the first region R1.

The sacrificial insulating layers 118 may be selectively removed with reference to the interlayer insulating layers 120, the second horizontal conductive layer 104, and the substrate insulating layer 121 using wet etching, for example. Accordingly, the second tunnel portions TL2 may be formed between the interlayer insulating layers 120. In this process, a portion of the first and second nitride layers 150L and 150U may also be removed. For example, the first and second nitride layers 150L and 150U may be removed from regions corresponding to the first and second dummy gate electrodes 131D and 132D illustrated in FIG. 3A.

Figure 13J:
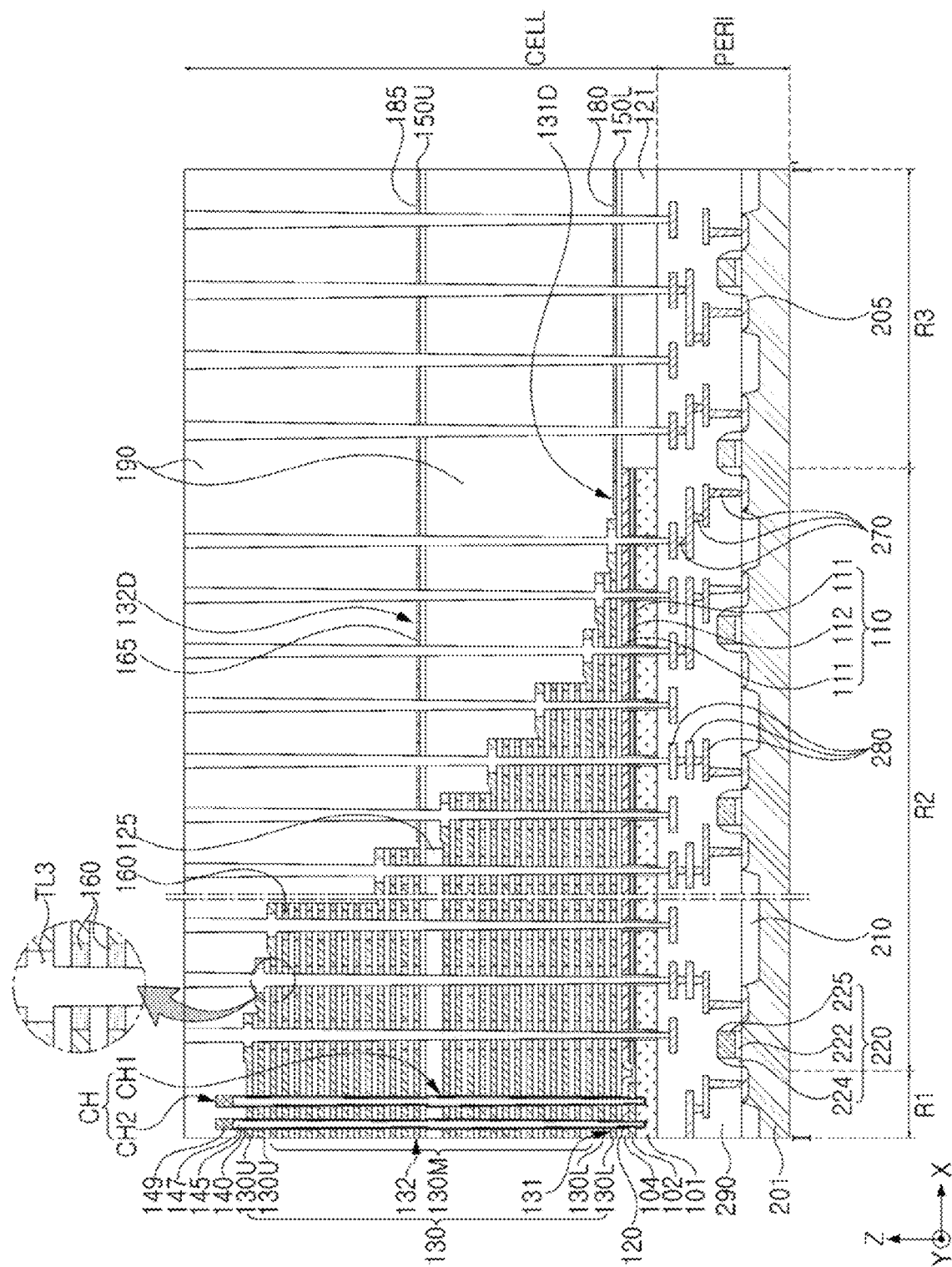

Referring to FIG. 13J, the gate electrodes 130 may be formed by filling the second tunnel portions TL2 with a conductive material, the vertical sacrificial layers 191 may be removed, and the preliminary contact plug insulating layers 160P may be partially removed.

Before the gate electrodes 130 are formed, a portion of the gate dielectric layer 145 extending vertically along the gate electrode 130 may be formed, and the gate electrodes 130 and the first and second dummy gate electrodes 131D and 132D may be formed. The conductive material forming the gate electrodes 130 may fill the second tunnel portions TL2. The conductive material may include a metal, polycrystalline silicon, or metal silicide material. After the gate electrodes 130 is formed, the separation insulating layer 105 may be formed in the openings formed in the regions of the first and second separation regions MS1 and MS2.

The vertical sacrificial layers 191 in the openings OH may be selectively removed. After the vertical sacrificial layers 191 are removed, the exposed preliminary contact plug insulating layers 160P may be partially removed. In this case, in the pad regions 130P, the preliminary contact plug insulating layers 160P may be entirely removed such that third tunnel portions TL3 may be formed, and the preliminary contact plug insulating layers 160P may remain in a lower portion and may form the first contact plug insulating layers 160. In the third tunnel portions TL3, after the preliminary contact plug insulating layers 160P are removed, the exposed gate dielectric layer 145 may also be partially removed to expose side surfaces of the gate electrodes 130. On a level corresponding to the first and second nitride layers 150L and 150U, the preliminary contact plug insulating layers 160P may remain and may form the second contact plug insulating layer 165 and the first and second through plug insulating layers 180 and 185.

Figure 13K:
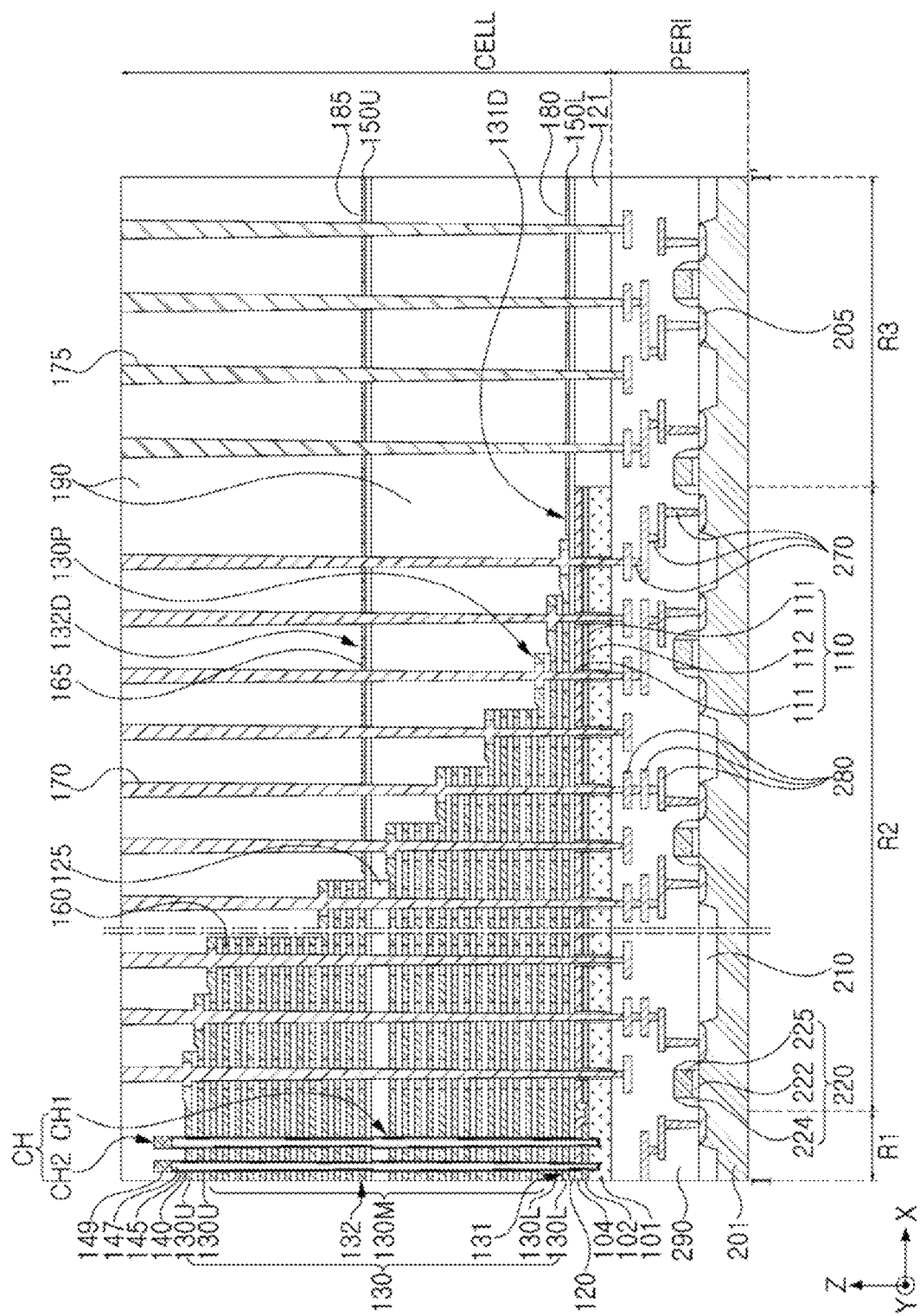

Referring to FIG. 13K, contact plugs 170 and through contact plugs 175 may be formed by depositing a conductive material in the openings OH.

The circuit interconnection lines 280 may be exposed by removing the pad layers 285 (see FIG. 4C) from a lower end of the openings OH, and the conductive material may be deposited. The contact plugs 170 and the through contact plugs 175 may be formed together in the same process, and thus the contact plugs 170 and the through contact plugs 175 may have the same structure. The contact plugs 170 may be formed to have horizontal extension portions 170H (see FIG. 4A) in the pad regions 130P, thereby being physically and electrically connected to the gate electrodes 130.

Referring back to FIG. 3A, the semiconductor device 100 may be manufactured by forming cell interconnection lines 195 connected to the upper ends of the through contact plugs 175 and the contact plugs 170.

Figure 14:
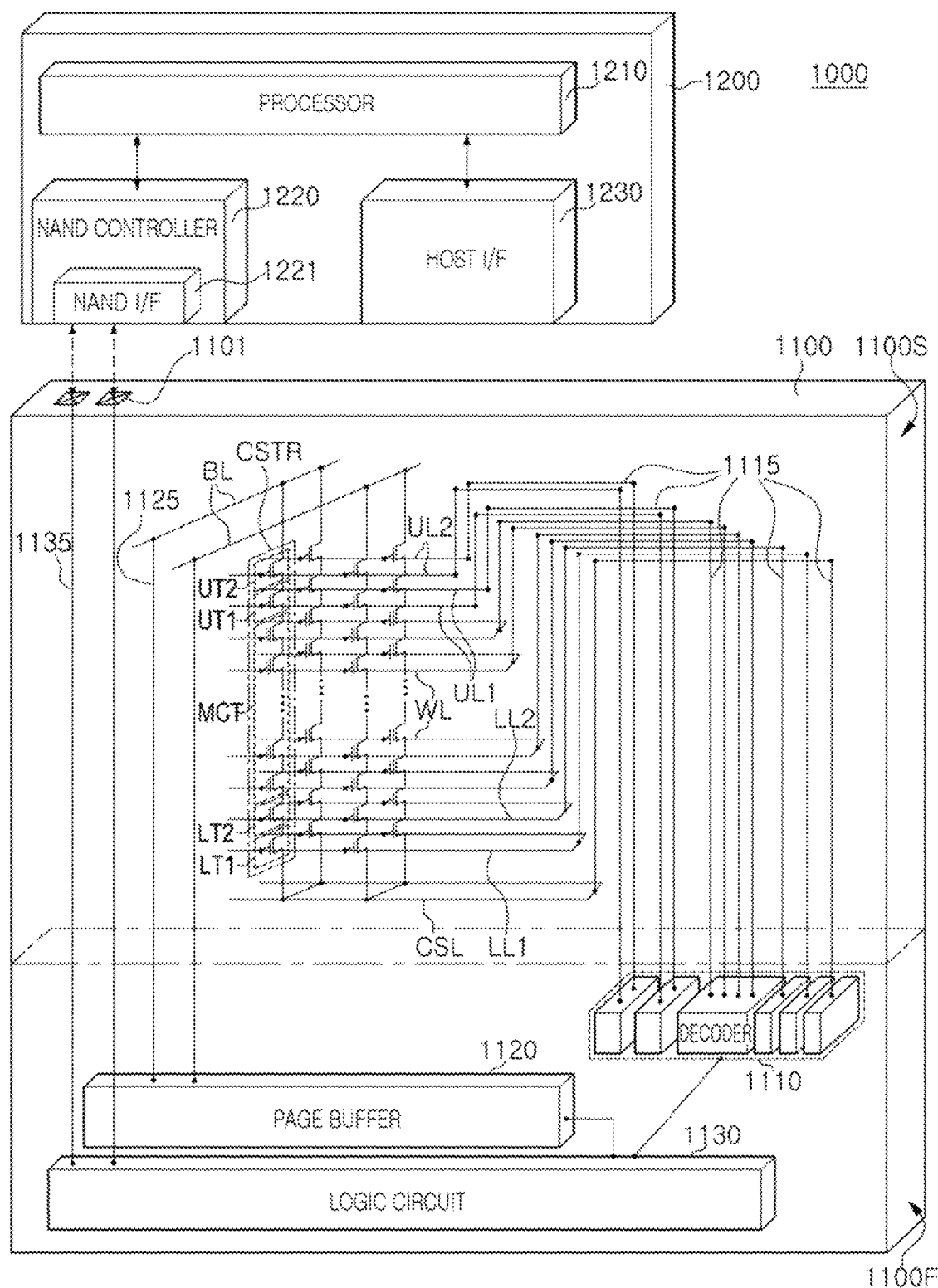
FIG. 14 is a view illustrating a data storage system including a semiconductor device according to an example embodiment.

FIG. 14 is a view illustrating a data storage system including a semiconductor device according to an example embodiment.

Referring to FIG. 14, a data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. For example, the data storage system 1000 may be implemented as a solid state drive device (SSD) device, a universal serial bus (USB), a computing system, a medical device, or a communication device, including one or a plurality of semiconductor devices 1100.

The semiconductor device 1100 may be implemented as a nonvolatile memory device, and may be implemented as the NAND flash memory device described with reference to FIGS. 1 to 12, for example. The semiconductor device 1100 may include a first semiconductor structure 1100F and a second semiconductor structure 1100S on the first semiconductor structure 1100F. In some example embodiments, the first semiconductor structure 1100F may be disposed on the side of the second semiconductor structure 1100S. The first semiconductor structure 1100F may be configured as a peripheral circuit structure including a decoder circuit 1110, a page buffer 1120, and a logic circuit 1130. The second semiconductor structure 1100S may be configured as a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

In some example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the semiconductor structure 1100F to the second semiconductor structure 1100S. The bit lines BL may be electrically connected to the page buffer 1120 through second connection interconnections 1125 extending from the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input and output pad 1101 electrically connected to the logic circuit 1130. The input and output pad 1101 may be electrically connected to the logic circuit 1130 through an input and output connection interconnection 1135 extending from the first semiconductor structure 1100F to the second semiconductor structure 1100S.

The controller 1200 may include a processor 1210, a NAND controller 1220, and a host interface 1230. In some example embodiments, the data storage system 1000 may include a plurality of semiconductor devices 1100, and in this case, the controller 1200 may control the plurality of semiconductor devices 1100.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. Control commands for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 15:
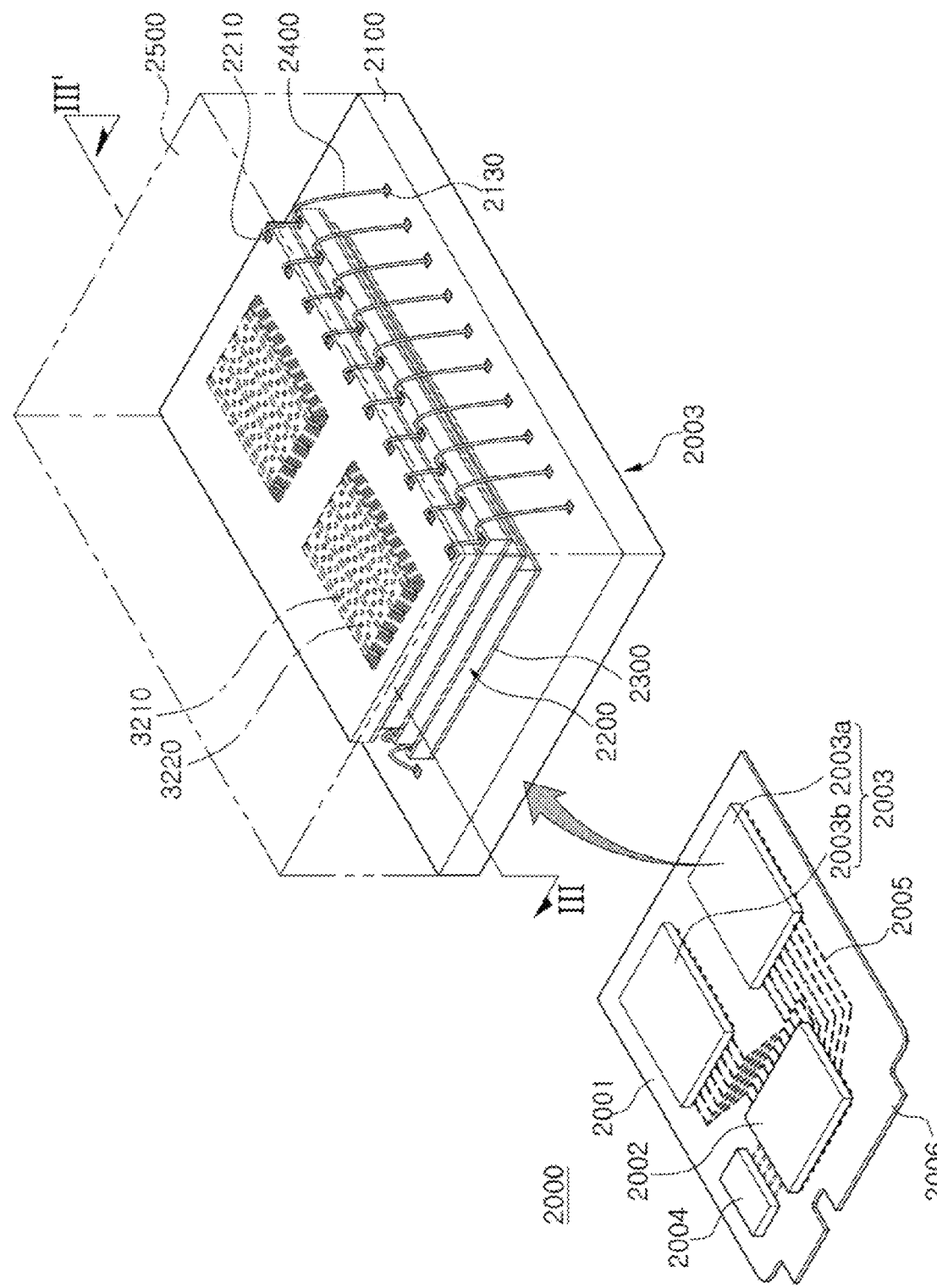
FIG. 15 is a perspective view illustrating a data storage system including a semiconductor device according to an example embodiment.

FIG. 15 is a perspective view illustrating a data storage system including a semiconductor device according to an example embodiment.

Referring to FIG. 15, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and the arrangement of the plurality of pins in the connector 2006 may be varied depending on a communication interface between the data storage system 2000 and the external host. In some example embodiments, the data storage system 2000 may communication with the external host through one of a universal serial bus (USB), a peripheral component interconnect express (PCI-Express), a serial advanced technology attachment (SATA), and an M-phy for universal flash storage (UFS). In some example embodiments, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be configured as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 further may include a DRAM controller for controlling the DRAM 2004 in addition to the NAND controller for controlling the semiconductor package 2003.

The semiconductor package 2003 may include first and second semiconductor packages 2003$a$ and 2003$b$ spaced apart from each other. Each of the first and second semiconductor packages 2003$a$ and 2003$b$ may be configured as a semiconductor package including a plurality of semiconductor chips 2200. Each of the first and second semiconductor packages 2003$a$ and 2003$b$ may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including the package upper pads 2130. Each of the semiconductor chips 2200 may include an input and output pad 2210. The input and output pad 2210 may correspond to the input and output pad 1101 in FIG. 14. Each of the semiconductor chips 2200 may include gate stack structures 3210 and channel structures 3220. Each of the semiconductor chips 2200 may include the semiconductor device described with reference to FIGS. 1 to 12.

In some example embodiments, the connection structure 2400 may be a bonding wire electrically connecting the input and output pad 2210 to the package upper pads 2130. Accordingly, in each of the first and second semiconductor packages 2003$a$ and 2003$b$, the semiconductor chips 2200 may be electrically connected to each other through a bonding wire method, and may be electrically connected to the package upper pads 2130 of the package substrate 2100. In some example embodiments, in each of the first and second semiconductor packages 2003$a$ and 2003$b$, the semiconductor chips 2200 may be electrically connected to each other by a connection structure a through silicon via (TSV), instead of the connection structure 2400 of a bonding wire method.

In some example embodiments, the controller 2002 and the semiconductor chips 2200 may be included in a single package. For example, the controller 2002 and the semiconductor chips 2200 may be mounted on a separate interposer substrate different from the main substrate 2001, and the controller 2002 may be connected to the semiconductor chips 2200 by interconnections formed on the interposer substrate.

Figure 16:
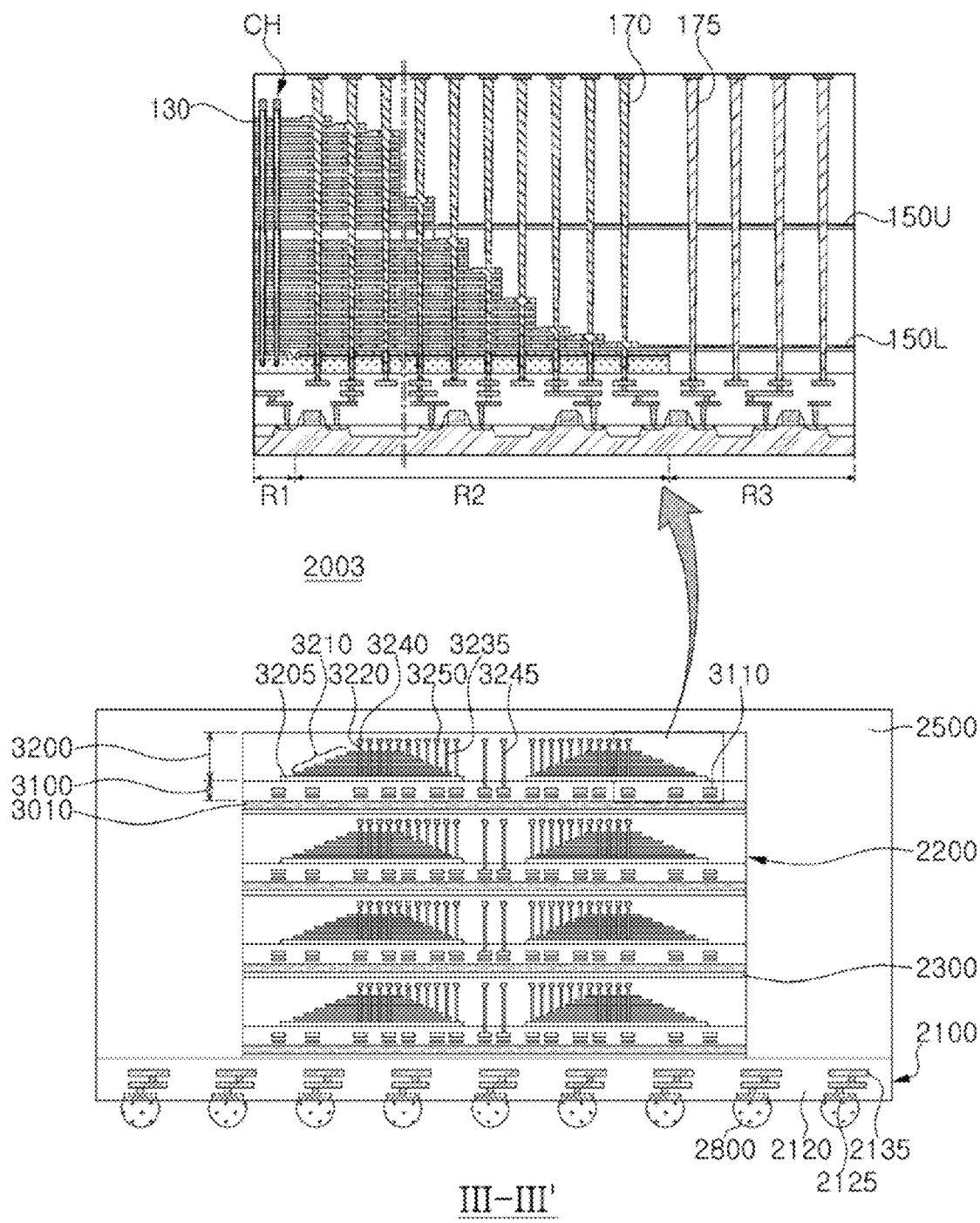
FIG. 16 is a cross-sectional view illustrating a semiconductor device according to an example embodiment.

FIG. 16 is a cross-sectional view illustrating a semiconductor device according to an example embodiment. FIG. 16 illustrates an example embodiment of the semiconductor package 2003 in FIG. 15, and illustrates the semiconductor package 2003 in FIG. 15 taken along line III-III'.

Referring to FIG. 16, in the semiconductor package 2003, the package substrate 2100 may be configured as a printed circuit board. The package substrate 2100 may include a package substrate body portion 2120, package upper pads 2130 (see FIG. 15) disposed on an upper surface of the package substrate body portion 2120, lower pads 2125 disposed on a lower surface of the package substrate body portion 2120 or exposed through the lower surface, and internal interconnections 2135 electrically connecting the upper pads 2130 to the lower pads 2125 in the package substrate body portion 2120. The upper pads 2130 may be electrically connected to the connection structures 2400. The lower pads 2125 may be connected to the interconnection patterns 2005 of the main substrate 2001 of the data storage system 2000 through conductive connection portions 2800 as in FIG. 14.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 and separation structures 3230 penetrating the gate stack structure 3210, bit lines 3240 electrically connected to the channel structures 3220, and contact plugs 3235 electrically connected to the word lines WL (see FIG. 14) of the gate stack structure 3210. As described with reference to FIGS. 1 to 12, in each of the semiconductor chips 2200, the first and second nitride layers 150L and 150U may remain in a portion of the second region R2 and in the third region R3.

Each of the semiconductor chips 2200 may include a through interconnection 3245 electrically connected to the peripheral interconnections 3110 of the first structure 3100 and extending into the second semiconductor structure 3200. The through interconnection 3245 may be disposed on an external side of the gate stack structure 3210, and may be further disposed to penetrate the gate stack structure 3210. Each of the semiconductor chips 2200 may further include an input and output pad 2210 (see FIG. 15) electrically connected to the peripheral interconnections 3110 of the first structure 3100.

Example embodiments may include a contact plug structure surrounded by first contact plug insulating layers and a remaining nitride layer for forming pad regions of gate electrodes.

As described above, an example embodiment may provide a semiconductor device having improved productivity. An example embodiment may provide a data storage system including a semiconductor device having improved productivity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a first semiconductor structure including a first substrate and circuit devices on the first substrate; and
    a second semiconductor structure disposed on the first semiconductor structure, wherein the second semiconductor structure includes:
    a second substrate having a first region and a second region;
    gate electrodes stacked and spaced apart from each other in a first direction on the first region, extending in a second direction by different lengths on the second region, and each including a pad region having an upper surface exposed upwardly in the second region;
    interlayer insulating layers alternately stacked with the gate electrodes;
    channel structures penetrating the gate electrodes, extending in the first direction, and each including a channel layer;
    separation regions penetrating the gate electrodes and extending in the second direction in the first region and the second region;
    contact plugs each penetrating the pad region of each of the gate electrodes and extending into the first semiconductor structure in the first direction;
    first contact plug insulating layers alternately disposed with the interlayer insulating layers below the pad region and surrounding each of the contact plugs;
    through plugs extending in the first direction to electrically connect the first semiconductor structure to the second semiconductor structure in a third region on an external side of the second substrate;
    first through plug insulating layers surrounding the through plugs on a level lower than a level of an upper surface of a lowermost first gate electrode among the gate electrodes; and
    a first nitride layer in contact with external side surfaces of the first through plug insulating layers and extending horizontally in the third region.

2. The semiconductor device as claimed in claim 1, wherein the first nitride layer is disposed to be spaced apart from the lowermost first gate electrode in the second direction.

3. The semiconductor device as claimed in claim 1, wherein the first nitride layer has a first thickness, and each of the gate electrodes has a second thickness greater than the first thickness in the pad region.

4. The semiconductor device as claimed in claim 3, wherein:
    each of the gate electrodes has a third thickness smaller than the second thickness in a region other than the pad region, and
    the third thickness is equal to or greater than the first thickness.

5. The semiconductor device as claimed in claim 1, wherein the second semiconductor structure further includes a first dummy gate electrode spaced apart from the lowermost first gate electrode, disposed on a level corresponding to a level of the first nitride layer, and having a region extending farther than the separation regions to an external side of the separation regions in the second direction.

6. The semiconductor device as claimed in claim 5, wherein the first dummy gate electrode is disposed to surround ends of the separation regions in the second direction.

7. The semiconductor device as claimed in claim 5, wherein the first nitride layer is in contact with a side surface of the first dummy gate electrode.

8. The semiconductor device as claimed in claim 1, wherein:
each of the channel structures includes first and second channel structures stacked in the first direction, and
the second semiconductor structure further includes second contact plug insulating layers surrounding the contact plugs on a level lower than a level of an upper surface of a second gate electrode most adjacent to lower ends of the second channel structures among the gate electrodes.

9. The semiconductor device as claimed in claim 8, wherein the second semiconductor structure further includes:
second through plug insulating layers surrounding the through plugs on a level corresponding to a level of the second contact plug insulating layers; and
a second nitride layer in contact with external side surfaces of the second through plug insulating layers and extending horizontally.

10. The semiconductor device as claimed in claim 9, wherein the second semiconductor structure further includes a second dummy gate electrode in contact with external side surfaces of the second contact plug insulating layers and in contact with the second nitride layer.

11. The semiconductor device as claimed in claim 1, wherein each of the contact plugs includes a vertical extension portion extending in the first direction and a horizontal extension portion extending horizontally from the vertical extension portion so as to be in contact with the pad region.

12. The semiconductor device as claimed in claim 11, wherein a length from a side surface of the vertical extension portion to an end of the horizontal extension portion is less than a length from the side surface of the vertical extension portion to an end of each of the first contact plug insulating layers.

13. The semiconductor device as claimed in claim 1, wherein the first semiconductor structure further includes pad layers surrounding the contact plugs on lower ends of the contact plugs.

14. A semiconductor device, comprising:
a substrate having a first region and a second region;
gate electrodes stacked and spaced apart from each other in a first direction on the first region, extending in a second direction by different lengths on the second region, and each including a pad region having an upper surface exposed upwardly in the second region;
channel structures penetrating the gate electrodes, extending in the first direction, and each including a channel layer;
separation regions penetrating the gate electrodes and extending in the second direction in the first region and the second region;
contact plugs each penetrating the pad region of each of the gate electrodes and extending in the first direction;
a nitride layer disposed in an external side of a lowermost first gate electrode among the gate electrodes, spaced apart from the lowermost first gate electrode, and extending horizontally; and
a dummy gate electrode disposed between the lowermost first gate electrode and the nitride layer in the second direction and having a first end spaced apart from the lowermost first gate electrode.

15. The semiconductor device as claimed in claim 14, wherein the dummy gate electrode has a second end opposing the first end in the second direction and in contact with the nitride layer.

16. The semiconductor device as claimed in claim 14, wherein the dummy gate electrode has a region extending farther than the separation regions to an external side of the separation regions in the second direction.

17. The semiconductor device as claimed in claim 14, wherein the nitride layer is disposed on a level corresponding to or lower than a level of the lowermost first gate electrode.

18. The semiconductor device as claimed in claim 14, wherein a lower surface of the nitride layer is disposed on a level higher than a level of an upper surface of the substrate.

* * * * *